US011940478B2

(12) United States Patent
Franklin et al.

(10) Patent No.: US 11,940,478 B2
(45) Date of Patent: Mar. 26, 2024

(54) ELECTRONIC DEVICE CHARACTERIZATION SYSTEMS AND METHODS

(71) Applicant: Duke University, Durham, NC (US)

(72) Inventors: Aaron D. Franklin, Durham, NC (US); Steven G. Noyce, Durham, NC (US); James L Doherty, Durham, NC (US)

(73) Assignee: Duke University, Durham, NC (US)

( * ) Notice: Subject to any disclaimer, the term of this patent is extended or adjusted under 35 U.S.C. 154(b) by 138 days.

(21) Appl. No.: 17/544,916

(22) Filed: Dec. 7, 2021

(65) Prior Publication Data
US 2022/0178983 A1 Jun. 9, 2022

Related U.S. Application Data

(60) Provisional application No. 63/122,089, filed on Dec. 7, 2020.

(51) Int. Cl.
*G01R 31/00* (2006.01)
*G01R 1/04* (2006.01)

(52) U.S. Cl.
CPC ......... *G01R 31/003* (2013.01); *G01R 1/0458* (2013.01)

(58) Field of Classification Search
CPC .............. G01R 31/003; G01R 31/2642; G01R 31/2817; G01R 31/2855; G01R 31/2849;
(Continued)

(56) References Cited

U.S. PATENT DOCUMENTS 3,656,058 A * 4/1972 Leathers ................ H01R 31/00
324/756.05
5,539,305 A * 7/1996 Botka .................. G01R 35/005
324/750.02
(Continued)

FOREIGN PATENT DOCUMENTS

CN 209148833 U * 7/2019
CN 111965527 A * 11/2020
(Continued)

OTHER PUBLICATIONS

VSE., The Basics of Environmental Testing of Electronics. VSE | Test Department May 14, 2020 (Year: 2020).*
(Continued)

*Primary Examiner* — Patrick Assouad
*Assistant Examiner* — Sean Curtis
(74) *Attorney, Agent, or Firm* — Barnes & Thornburg LLP

(57) ABSTRACT

Electronic device characterization platforms, systems, devices, and methods for use in testing instruments, devices, and sensors that is portable, modular, multiplexed, and automated are disclosed. The system includes a substrate, a chip adapter, such as a chip socket, and an optional housing. Chip samples to be tested can be disposed in the chip adapter and various environmental modules designed to supply different environmental conditions to the chip sample can be disposed over the chip adapter, enabling testing of the chip samples to be performed in the different environment conditions. The system can further include various connectors that allow for add-on modules to be included as part of the system. Methods of characterizing electronic devices and sensors are also disclosed.

21 Claims, 8 Drawing Sheets

(58) Field of Classification Search
CPC ............ G01R 31/2872; G01R 31/2874; G01R 31/2881; G01R 1/0425; G01R 1/0458
See application file for complete search history.

(56) References Cited

U.S. PATENT DOCUMENTS

| | | | | |
|---|---|---|---|---|
| 5,929,628 | A * | 7/1999 | Becker | G01R 35/005 324/750.02 |
| 6,353,329 | B1 * | 3/2002 | Kiffe | G01R 1/0466 324/762.02 |
| 6,449,741 | B1 * | 9/2002 | Organ | G01R 1/025 714/724 |
| 6,741,089 | B2 * | 5/2004 | Conroy | G01R 1/0466 324/750.06 |
| 6,914,424 | B2 * | 7/2005 | Chi | G01R 31/2868 324/757.04 |
| 7,097,488 | B2 * | 8/2006 | Hayakawa | H01R 13/2435 439/330 |
| 8,704,542 | B2 * | 4/2014 | Tiengtum | G01R 1/0458 324/750.28 |
| 8,829,934 | B2 | 9/2014 | Sellathamby et al. | |
| 9,164,142 | B2 * | 10/2015 | Coq | G01R 31/2817 |
| 9,261,533 | B2 | 2/2016 | Rashidzadeh et al. | |
| 9,442,151 | B2 * | 9/2016 | Tubul | G01R 31/66 |
| 10,520,544 | B2 * | 12/2019 | Mardi | G01R 31/2877 |
| 10,551,423 | B1 * | 2/2020 | Siddiqui | G01R 31/2872 |
| 10,955,466 | B2 * | 3/2021 | Tsai | G01R 31/2877 |
| 11,119,147 | B2 * | 9/2021 | Tsai | G11C 29/56016 |
| 11,183,265 | B2 * | 11/2021 | Tsai | G11C 29/06 |
| 11,193,971 | B2 * | 12/2021 | Tsai | G11C 29/44 |
| 11,199,571 | B2 * | 12/2021 | Shi | G01R 31/2607 |
| 11,226,362 | B2 * | 1/2022 | Tsai | G01R 31/2874 |
| 11,327,110 | B2 * | 5/2022 | Tsai | G01R 31/2856 |
| 11,327,111 | B2 * | 5/2022 | Tsai | G01R 31/2863 |
| 11,366,136 | B2 * | 6/2022 | Tsai | G01R 31/2887 |
| 11,366,155 | B2 * | 6/2022 | Tsai | G01R 1/0458 |
| 2003/0132770 | A1 * | 7/2003 | Conroy | G01R 1/0466 324/750.06 |
| 2003/0141860 | A1 * | 7/2003 | Chi | G01R 31/2868 324/750.03 |
| 2005/0181656 | A1 * | 8/2005 | Hayakawa | H01R 13/2435 439/331 |
| 2008/0106294 | A1 * | 5/2008 | Smith | G01R 31/2889 324/750.16 |
| 2013/0008628 | A1 * | 1/2013 | Tiengtum | G01R 1/0458 248/224.7 |
| 2014/0125365 | A1 * | 5/2014 | Coq | G01R 31/2862 702/117 |
| 2015/0355261 | A1 * | 12/2015 | Tubul | G01R 31/68 324/538 |
| 2018/0055434 | A1 * | 3/2018 | Cheung | A61B 5/16 |
| 2018/0059174 | A1 * | 3/2018 | Mardi | G01R 31/2877 |
| 2018/0113151 | A1 * | 4/2018 | Wu | G01R 31/2877 |
| 2021/0018558 | A1 * | 1/2021 | Tsai | G11C 29/06 |
| 2021/0018559 | A1 * | 1/2021 | Tsai | G11C 29/06 |
| 2021/0018560 | A1 * | 1/2021 | Tsai | G01R 31/2875 |
| 2021/0020260 | A1 * | 1/2021 | Tsai | G11C 29/56016 |
| 2021/0088574 | A1 * | 3/2021 | Shi | G01R 1/0466 |
| 2021/0132140 | A1 * | 5/2021 | Tsai | G01R 1/0458 |
| 2021/0132142 | A1 * | 5/2021 | Tsai | G01R 31/2874 |
| 2021/0311107 | A1 * | 10/2021 | Tsai | G01R 31/2808 |
| 2021/0364568 | A1 * | 11/2021 | Tsai | G01R 31/2875 |
| 2022/0128600 | A1 * | 4/2022 | Tsai | H01L 24/72 |
| 2022/0178983 | A1 * | 6/2022 | Franklin | G01R 1/0458 |
| 2023/0047762 | A1 * | 2/2023 | Nguyen | G01R 1/0458 |
| 2023/0176669 | A1 * | 6/2023 | Gupta | G06F 3/0443 345/174 |
| 2023/0182765 | A1 * | 6/2023 | Chou | G01S 7/4095 701/23 |

FOREIGN PATENT DOCUMENTS

| | | | | |
|---|---|---|---|---|
| CN | 110726918 | B * | 4/2022 | G01R 1/0416 |
| CN | 115015737 | A * | 9/2022 | |
| CN | 115436774 | A * | 12/2022 | G01R 31/2896 |
| GB | 2392251 | A * | 2/2004 | |
| KR | 20210141862 | A * | 11/2021 | |
| TW | 201248641 | A * | 12/2012 | |
| WO | 1998025153 | A2 | 6/1998 | |
| WO | WO-0169268 | A2 * | 9/2001 | |
| WO | WO-0198793 | A2 * | 12/2001 | C23C 18/00 |
| WO | 2007146581 | A2 | 12/2007 | |

OTHER PUBLICATIONS

English Translation of TW201248641A (Year: 2012).*
Active Learning Enabled by the ADALM1000 Active Learning Module (2 pages).
Akhterov, M. V.; Choi, Y.; Olsen, T. J.; Sims, P. C.; Iftikhar, M.; Gul, O. T.; Corso, B. L.; Weiss, G. A.; Collins, P. G. Observing Lysozymes Closing and Opening Motions by High-Resolution Single-Molecule Enzymology. ACS Chem. Biol. 2015, 10 (6), 1495-1501.
Aleta, A.; Martin-Corral, D.; Pastore Y Piontti, A.; Ajelli, M.; Litvinova, M.; Chinazzi, M.; Dean, N. E.; Halloran, M. E.; Longini, I. M.; Merler, S.; et al. Modeling the Impact of Social Distancing, Testing, Contact Tracing and Household Quarantine on Second-Wave Scenarios of the COVID-19 Epidemic.; Cold Spring Harbor Laboratory Preprints, 2020; pp. 1-31.
Analog Discovery 2 Reference Manual (29 pages).
Andrews, J. B.; Cardenas, J. A.; Lim, C. J.; Noyce, S. G.; Mullett, J.; Franklin, A. D. Fully Printed and Flexible Carbon Nanotube Transistors for Pressure Sensing in Automobile Tires. IEEE Sens. J. 2018, 18 (19).
Aouida, S.; Benabderrahmane Zaghouani, R.; Bachtouli, N.; Bessais, B. Hydrogen Passivation of Silicon Nanowire Structures. Appl. Surf. Sci. 2016, 370, 49-52.
Bachtold, A.; Fuhrer, M. S.; Plyasunov, S.; Forero, M.; Anderson, E. H.; Zetti, A.; McEuen, P. L. Scanned Probe Microscopy of Electronic Transport in Carbon Nanotubes. Phys. Rev. Lett. 2000, 84 (26), 6082-6085.
Baidoo, J.; Matsunaga, M.; Higuchi, A.; Yamanaka, T.; Ochiai, Y.; Bird, J. P.; Aoki, N.; Gong, Y.; Zhang, X.; Vajtai, R.; et al. Field-Effect Characterization of Polymorphic Molybdenum Disulfide Using Scanning Probe Techniques.
Bampoulis, P.; Van Bremen, R.; Yao, Q.; Poelsema, B.; Zandvliet, H. J. W.; Sotthewes, K. Defect Dominated Charge Transport and Fermi Level Pinning in MoS2/Metal Contacts. ACS Appl. Mater. Interfaces 2017, 9 (22), 19278-19286.
Bao, Z.; Sun, J.; Zhao, X.; Li, Z.; Cui, S.; Meng, Q.; Zhang, Y.; Wang, T.; Jiang, Y. Top-down Nanofabrication of Silicon Nanoribbon Field Effect Transistor (Si—NR FET) for Carcinoembryonic Antigen Detection. Int. J. Nanomedicine 2017, 12, 4623-4631.
Bargaoui, Y.; Troudi, M.; Bondavalli, P.; Sghaier, N. Gate Bias Stress Effect in Single-Walled Carbon Nanotubes Field-Effect-Transistors. Diam. Relat. Mater. 2018, 84 (2017), 62-65.
Bauer, J.; Fleischer, F.; Breitenstein, O.; Schubert, L.; Werner, P.; Gösele, U.; Zacharias, M. Electrical Properties of Nominally Undoped Silicon Nanowires Grown by Molecular-Beam Epitaxy. Appl. Phys. Lett. 2007, 90 (1), 012105.
Besteman, K.; Lee, J .- O. O.; Wiertz, F. G. M. M.; Heering, H. A.; Dekker, C. Enzyme-Coated Carbon Nanotubes as Single-Molecule Biosensors. Nano Lett. 2003, 3 (6), 727-730.
Bhandari, S.; Westervelt, R. M. Imaging Electron Motion in Graphene. Semicond. Sci. Technol. 2017, 32 (2).
Bouilly, D.; Hon, J.; Daly, N. S.; Trocchia, S.; Vernick, S.; Yu, J.; Warren, S.; Wu, Y.; Gonzalez, R. L.; Shepard, K. L.; et al. Single-Molecule Reaction Chemistry in Patterned Nanowells. Nano Lett. 2016, 16 (7), 4679-4685.
Byon, H. R.; Choi, H. C. Network Single-Walled Carbon Nanotube-Field Effect Transistors (SWNT-FETs) with Increased Schottky Contact Area for Highly Sensitive Biosensor Applications. J. Am. Chem. Soc. 2006, 128 (7), 2188-2189.
Cal, B.; Wang, S.; Huang, L.; Ning, Y.; Zhang, Z.; Zhang, G. J. Ultrasensitive Label-Free Detection of PNA-DNA Hybridization by Reduced Graphene Oxide Field-Effect Transistor Biosensor. ACS Nano 2014, 8 (3), 2632-2638.

(56) References Cited

OTHER PUBLICATIONS

Camilli, L.; Passacantando, M. Advances on Sensors Based on Carbon Nanotubes. Chemosensors. MDPI Multidisciplinary Digital Publishing Institute Dec. 1, 2018, p. 62.

Campos, R.; Borme, J.; Guerreiro, J. R.; Machado, G.; Cerqueira, M. F.; Petrovykh, D. Y.; Alpuim, P. Attomolar Label-Free Detection of Dna Hybridization with Electrolyte-Gated Graphene Field-Effect Transistors. ACS Sensors 2019, 4 (2), 286-293.

Cannon, D. W.; Magee, D. P.; Book, W. J.; Lew, J. Y. Experimental Study on Micro/Macro Manipulator Vibration Control. Robot. Autom. 1996. Proceedings., 1996 IEEE Int. Conf. 1996, 3, 2549-2554.

Cao, Q.; Han, S. J.; Penumatcha, A. V.; Frank, M. M.; Tulevski, G. S.; Tersoff, J.; Haensch, W. E. Origins and Characteristics of the Threshold Voltage Variability of Quasiballistic Single-Walled Carbon Nanotube Field-Effect Transistors. ACS Nano 2015, 9 (2), 1936-1944.

Cardenas, J. A.; Andrews, J. B.; Noyce, S. G.; Franklin, A. D. Carbon Nanotube Electronics for IoT Sensors. Nano Futures. IOP Publishing Jan. 10, 2020, p. 012001.

Chen, X.; Hao, S.; Zong, B.; Liu, C.; Mao, S. Ultraselective Antibiotic Sensing with Complementary Strand DNA Assisted Aptamer/MoS2 Field-Effect Transistors. Biosens. Bioelectron. 2019, 145.

Chen, X.; Wu, Z.; Xu, S.; Wang, L.; Huang, R.; Han, Y.; Ye, W.; Xiong, W.; Han, T.; Long, G.; et al. Probing the Electron States and Metal-Insulator Transition Mechanisms in Molybdenum Disulphide Vertical Heterostructures. Nat. Commun. 2015, 6.

Chen, Y.; Ren, R.; Pu, H.; Guo, X.; Chang, J.; Zhou, G.; Mao, S.; Kron, M.; Chen, J. Field-Effect Transistor Biosensor for Rapid Detection of Ebola Antigen. Sci. Rep. 2017, 7 (1), 1-8.

Cheng, Z.; Cardenas, J. A.; McGuire, F.; Najmaei, S.; Franklin, A. D. Modifying the Ni—MoS2 Contact Interface Using a Broad-Beam Ion Source. IEEE Electron Device Lett. 2016, 37 (9), 1234-1237.

Choi, Y.; Moody, I. S.; Sims, P. C.; Hunt, S. R.; Corso, B. L.; Perez, I.; Weiss, G. A.; Collins, P. G. Single-Molecule Lysozyme Dynamics Monitored by an Electronic Circuit. Science (80 -.). 2012, 319 (January), 319-325.

Choi, Y.; Moody, I. S.; Sims, P. C.; Hunt, S. R.; Corso, B. L.; Seitz, D. E.; Blaszcazk, L. C.; Collins, P. G.; Weiss, G. A. Single-Molecule Dynamics of Lysozyme Processing Distinguishes Linear and Cross-Linked Peptidoglycan Substrates. J. Am. Chem. Soc. 2012, 134 (4), 2032-2035.

Choi, Y.; Olsen, T. J.; Sims, P. C.; Moody, I. S.; Corso, B. L.; Dang, M. N.; Weiss, G. A.; Collins, P. G. Dissecting Single-Molecule Signal Transduction in Carbon Nanotube Circuits with Protein Engineering. Nano Lett. 2013, 13 (2), 625-631.

Cid, C. C.; Riu, J.; Maroto, A.; Rius, F. X. Carbon Nanotube Field Effect Transistors for the Fast and Selective Detection of Human Immunoglobulin G. Analyst 2008, 133 (8), 1005-1008.

Clemens, J. T. Silicon Microelectronics Technology. Bell Labs Tech. J. 2002, 2 (4), 76-102.

Collins, P. G.; Arnold, M. S.; Avouris, P. Engineering Carbon Nanotubes and Nanotube Circuits Using Electrical Breakdown. Science (80-.). 2001, 292 (5517), 706-709.

Collins, P. G.; Bradley, K.; Ishigami, M.; Zettl, A. Extreme Oxygen Sensitivity of Electronic Properties of Carbon Nanotubes. Science (80-.). 2000, 287 (5459), 1801-1804.

Connolly, M. R.; Puddy, R. K.; Logoteta, D.; Marconcini, P.; Roy, M.; Griffiths, J. P.; Jones, G. A. C.; Maksym, P. A.; MacUcci, M.; Smith, C. G. Unraveling Quantum Hall Breakdown in Bilayer Graphene with Scanning Gate Microscopy. Nano Lett. 2012, 12 (11), 5448-5454.

Corso, B. L.; Perez, I.; Sheps, T.; Sims, P. C.; Gul, O. T.; Collins, P. G. Electrochemical Charge Transfer Resistance in Carbon Nanotube Composites. Nano Lett. 2014.

De Moraes, A. C. M.; Kubota, L. T. Recent Trends in Field-Effect Transistors-Based Immunosensors. Chemosensors. MDPI Multidisciplinary Digital Publishing Institute Oct. 21, 2016, p. 20.

Deen, D. A.; Olson, E. J.; Ebrish, M. A.; Koester, S. J. Graphene-Based Quantum Capacitance Wireless Vapor Sensors. IEEE Sens. J. 2014, 14 (5), 1459-1466.

Desai, S. B.; Madhvapathy, S. R.; Sachid, A. B.; Llinas, J. P.; Wang, Q.; Ahn, G. H.; Pitner, G.; Kim, M. J.; Bokor, J.; Hu, C.; et al. MoS2 Transistors with 1-Nanometer Gate Lengths. Science (80-.). 2016, 354 (6308), 99-102.

DiMaria, D.J.; Cartier, E.; Arnold, D. Impact Ionization, Trap Creation, Degradation, and Breakdown in Silicon Dioxide Films on Silicon. J. Appl. Phys. 1993, 73 (7), 3367-3384.

Dincer, C.; Bruch, R.; Costa-Rama, E.; Fernández-Abedul, M. T.; Merkoçi, A.; Manz, A.; Urban, G. A.; Güder, F. Disposable Sensors in Diagnostics, Food, and Environmental Monitoring. Adv. Mater. 2019, 31 (30), 1806739.

Döring, V.; Süss, T.; Hierold, C. Efficient Transfer of Carbon Nanotubes for Device Fabrication Using an LOR Resist Sacrificial Layer. Sensors Actuators, A Phys. 2014, 208 (June), 152-158.

EEVblog uCurrent Gold (3 pages).

Elnathan, R.; Kwiat, M.; Pevzner, A.; Engel, Y.; Burstein, L.; Khatchtourints, A.; Lichtenstein, A.; Kantaev, R.; Patolsky, F. Biorecognition Layer Engineering: Overcoming Screening Limitations of Nanowire-Based FET Devices. Nano Lett. 2012, 12 (10), 5245-5254.

Fanning, L. J.; Connor, A. M.; Wu, G. E. Development of the Immunoglobulin Repertoire. Clinical Immunology and Immunopathology. Academic Press Inc. Apr. 1, 1996, pp. 1-14.

Fasarakis, N.; Tsormpatzoglou, A.; Tassis, D. H.; Pappas, I.; Papathanasiou, K.; Bucher, M.; Ghibaudo, G.; Dimitriadis C. A. Compact Model of Drain Current in Short-Channel Triple-Gate FinFETs. IEEE Trans. Electron Devices 2012, 59 (7), 1891-1898.

Filipiak, M. S.; Rother, M.; Andoy, N. M.; Knudsen, A. C.; Grimm, S.; Bachran, C.; Swee, L. K.; Zaumseil, J.; Tarasov, A. Highly Sensitive, Selective and Label-Free Protein Detection in Physiological Solutions Using Carbon Nanotube Transistors with Nanobody Receptors. Sensors Actuators, B Chem. 2018, 255, 1507-1516.

Foster, A. S.; Lopez Gejo, F.; Shluger, A. L.; Nieminen, R. M. Vacancy and Interstitial Defects in Hafnia. Phys. Rev. B—Condens. Matter Mater. Phys. 2002, 65 (17), 1741171-17411713.

Franklin, A. D. Scaling, Stacking, and Printing: How 1D and 2D Nanomaterials Still Hold Promise for a New Era of Electronics. In Digest of Technical Papers—Symposium on VLSI Technology; Institute of Electrical and Electronics Engineers Inc., 2017; pp T44-T45.

Franklin, A. D.; Koswatta, S. O.; Farmer, D. B.; Smith, J. T.; Gignac, L.; Breslin, C. M.; Han, S.-J.; Tulevski, G. S.; Miyazoe, H.; Haensch, W.; et al. Carbon Nanotube Complementary Wrap-Gate Transistors. Nano Lett. 2013, 13 (6), 2490-2495.

Franklin, A. D.; Koswatta, S. O.; Farmer, D.; Tulevski, G. S.; Smith, J. T.; Miyazoe, H.; Haensch, W. Scalable and Fully Self-Aligned n-Type Carbon Nanotube Transistors with Gate-All-Around. In 2012 International Electron Devices Meeting; IEEE, 2012; pp. 4.5.1-4.5.4.

Zheng, Y.; Huang, L.; Zhang, Z.; Jiang, J.; Wang, K.; Peng, L. M.; W, G. Sensitivity Enhancement of Graphene Hall Sensors Modified by Single-Molecule Magnets at Room Temperature. RSC Adv. 2017, 7 (4), 1776-1781.

Lin, H.; Tiwari, S. Localized Charge Trapping Due to Adsorption in Nanotube Field-Effect Transistor and Its Field-Mediated Transport. Appl. Phys. Lett. 2006. 89 (7), 073507.

Lin, Y. Y.; Evans, R. D.; Welch, E.; Hsu, B. N.; Madison, A. C.; Fair, R. B. Low Voltage Electrowetting-on-Dielectric Platform Using Multi-Layer Insulators. Sensors Actuators, B Chem. 2010, 150 (1), 465-470.

Liu, G.; Rumyantsev, S. L.; Jiang, C.; Shur, M. S.; Balandin, A. A. Selective Gas Sensing with H-BN Capped MoS2 Heterostructure Thin-Film Transistors. IEEE Electron Device Lett. 2015, 36 (11), 1202-1204.

Liu, J.; Chen, X.; Wang, Q.; Xiao, M.; Zhong, D.; Sun, W.; Zhang, G.; Zhang, Z. Ultrasensitive Monolayer MoS2 Field-Effect Transistor Based DNA Sensors for Screening of Down Syndrome. Nano Lett. 2019, 19 (3), 1437-1444.

(56) References Cited

OTHER PUBLICATIONS

Loghin, F.; Abdellah, A.; Falco, A.; Becherer, M.; Lugli, P.; Rivadeneyra, A. Time Stability of Carbon Nanotube Gas Sensors. Meas. J. Int. Meas. Confed. 2019, 136, 323-325.

Maehashi, K.; Katsura, T.; Kerman, K.; Takamura, Y.; Matsumoto, K.; Tamiya, E. Label-Free Protein Biosensor Based on Aptamer-Modified Carbon Nanotube Field-Effect Transistors. Anal. Chem. 2007, 79 (2), 782-787.

Maehashi, K.; Matsumoto, K. Label-Free Electrical Detection Using Carbon Nanotube-Based Biosensors. Sensors. Molecular Diversity Preservation International Jul. 8, 2009, pp. 5368-5378.

Magliulo, M.; Mulla, M. Y.; Manoli, K.; De Tullio, D.; Seshadri, P.; Scamarcio, G.; Palazzo, G.; Torsi, L. Ultrasensitive Printable Biosensors for Point-of-Care Applications. SPIE Newsroom 2015.

Martel, R.; Schmidt, T.; Shea, H. R.; Hertel, T.; Avouris, P. Single- and Multi-Wall Carbon Nanotube Field-Effect Transistors. Appl. Phys. Lett. 1998, 73 (17), 2447-2449.

Matsunaga, M.; Higuchi, A.; He, G.; Bird, J. P.; Ochiai, Y.; Aoki, N. Imaging Local Transport Property within MoS2 Transistors by Scanning Gate Microscopy. In 2016 Compound Semiconductor Week, CSW; Institute of Electrical and Electronics Engineers Inc., 2016.

Mattmann, M.; Roman, C.; Helbling, T.; Bechstein, D.; Durrer, L.; Pohle, R.; Fleischer, M.; Hierold, C. Pulsed Gate Sweep Strategies for Hysteresis Reduction in Carbon Nanotube Transistors for Low Concentration No. 2 Gas Detection. Nanotechnology 2010, 21 (18), 185501.

McGuire, F. A.; Lin, Y. C.; Price, K.; Rayner, G. B.; Khandelwal, S.; Salahuddin, S.; Franklin, A. D. Sustained Sub-60 MV/Decade Switching via the Negative Capacitance Effect in MoS2 Transistors. Nano Lett. 2017, 17 (8), 4801-4806.

Mibus, M.; Jensen, C.; Hu, X.; Knospe, C.; Reed, M. L.; Zangari, G. Dielectric Breakdown and Failure of Anodic Aluminum Oxide Films for Electrowetting Systems. J. Appl. Phys. 2013, 114 (1), 014901.

Mohanty, S. P. Blosensors: A Tutorial Review Blosensors: A Tutorial Review. IEEE Potentials 2015, (Apr. 25, 2006), 35-40.

Mølhave, K.; Gudnason, S. B.; Pedersen, A. T.; Clausen, C. H.; Horsewell, A.; Bøggild, P. Transmission Electron Microscopy Study of Individual Carbon Nanotube Breakdown Caused by Joule Heating in Air. Nano Lett. 2006, 6 (8), 1663-1668.

Moon, D.; Han, J.; Member, S.; Meyyappan, M. Comparative Study of Field Effect Transistor Based Biosensors. IEEE Trans. Nanotechnol. 2016, 15 (6), 956-961.

Morikawa, S.; Dou, Z.; Wang, S. W.; Smith, C. G.; Watanabe, K.; Taniguchi, T.; Masubuchi, S.; Machida, T.; Connolly, M. R. Imaging Ballistic Carrier Trajectories in Graphene Using Scanning Gate Microscopy. Appl. Phys. Lett. 2015, 107 (24).

Mukherjee, S.; Meshik, X.; Choi, M.; Farid, S.; Datta, D.; Lan, Y.; Poduri, S.; Sarkar, K.; Baterdene, U.; Huang, C. E.; et al. A Graphene and Aptamer Based Liquid Gated FET-Like Electrochemical Biosensor to Detect Adenosine Triphosphate. IEEE Trans. Nanobioscience 2015, 14 (8), 967-972.

Muoth, M.; Helbling, T.; Durrer, L.; Lee, S.- W.; Roman, C.; Hierold, C. Hysteresis-Free Operation of Suspended Carbon Nanotube Transistors. Nat. Nanotechnol. 2010, 5 (8), 589-592.

Myny, K.; Van Veenendaal, E.; Gelinck, G. H.; Genoe, J.; Dehaene, W.; Heremans, P. An 8-Bit, 40-Instructions-per-Second Organic Microprocessor on Plastic Foil. IEEE J. Solid-State Circuits 2012, 47 (1), 284-291.

Nasri, B.; Wu. T.; Alharbi, A.; You, K. D.; Gupta, M.; Sebastian, S. P.; Kiani, R.; Shahrjerdi, D. Hybrid CMOS-Graphene Sensor Array for Subsecond Dopamine Detection. IEEE Trans. Biomed. Circuits Syst. 2017, 11 (6), 1192-1203.

Nazemi, H.; Joseph, A.; Park, J.; Emadi, A. Advanced Micro-and Nano-Gas Sensor Technology: A Review. Sensors (Switzerland). Mar. 14, 2019, p. 1285.

Noyce, S. G.; Doherty, J. L.; Cheng, Z.; Han, H.; Bowen, S.; Franklin, A. D. Electronic Stability of Carbon Nanotube Transistors under Long-Term Bias Stress. Nano Lett. 2019, 19 (3), 1460-1466.

Noyce, Steven G., et al. "Electronic stability of carbon nanotube transistors under long-term bias stress." Nano letters 19.3 (2019): 1460-1466.

Noyce, Steven G., et al. "Understanding and mapping sensitivity in MoS2 field-effect-transistor-based sensors." ACS nano 14.9 (2020): 11637-11647.

Noyce, Steven Gary. Mapping Sensitivity of Nanomaterial Field-Effect Transistors. Diss. Duke University, 2020.

Oh, J.; Yoo, G.; Chang, Y. W.; Kim, H. J.; Jose, J.; Kim, E.; Pyun, J. C.; Yoo, K. H. A Carbon Nanotube Metal Semiconductor Field Effect Transistor-Based Biosensor for Detection of Amyloid-Beta in Human Serum. Biosens. Bioelectron. 2013, 50, 345-350.

Olsen, T. J.; Choi, Y .; Sims, P. C.; Gul, O. T.; Corso, B. L.; Dong, C.; Brown, W. A.; Collins, P. G.; Weiss, G. A. Electronic Measurements of Single-Molecule Processing by DNA Polymerase i (Klenow Fragment). J. Am. Chem. Soc. 2013, 135 (21), 7855-7860.

Ossila X200 User Manual (29 pages).

Pan, D.; Fuller, E. J .; Gul, O. T.; Collins, P. G. One-Dimensional Poole-Frenkel Conduction in the Single Defect Limit. Nano Lett. 2015, 15 (8), 5248-5253.

Pandana, H.; Aschenbach, K. H.; Lenski, D. R.; Fuhrer, M. S .; Khan, J .; Gomez, R. D. A Versatile Biomolecular Charge-Based Sensor Using Oxide-Gated Carbon Nanotube Transistor Arrays. IEEE Sens. J. 2008, 8 (6), 655-660.

Pascher, N.; Bischoff, D.; Ihn, T.; Ensslin, K. Scanning Gate Microscopy on a Graphene Nanoribbon. Appl. Phys. Lett. 2012, 101 (6).

Paterson, A. F.; Anthopoulos, T. D. Enabling Thin-Film Transistor Technologies and the Device Metrics That Matter. Nature Communications. Nature Publishing Group Dec. 1, 2018, pp. 1-4.

Pei, X.; Zhang, B.; Tang, J.; Liu, B.; Lai, W.; Tang, D. Sandwich-Type Immunosensors and Immunoassays Exploiting Nanostructure Labels: A Review. Anal. Chim. Acta 2013, 758, 1-18.

Peng, N.; Zhang, Q.; Chow, C. L.; Tan, O. K.; Marzari, N. Sensing Mechanisms for Carbon Nanotube Based NH 3 Gas Detection. Nano Lett. 2009, 9 (4), 1626-1630.

Peng, N.; Zhang, Q.; Yuan, S.; Li, H.; Tian, J.; Chan, L. Current Instability of Carbon Nanotube Field Effect Transistors. Nanotechnology 2007, 18 (42), 424035.

Perkins, F. K.; Friedman, A. L.; Cobas, E.; Campbell, P. M.; Jernigan, G. G.; Jonker, B. T. Chemical Vapor Sensing with Monolayer MoS2. Nano Lett. 2013, 13 (2), 668-673.

Pop, E. The Role of Electrical and Thermal Contact Resistance for Joule Breakdown of Single-Wall Carbon Nanotubes. Nanotechnology 2008, 19 (29), 295202.

Pop, E.; Mann, D.; Wang, Q.; Goodson, K.; Dai, H. Thermal Conductance of an Individual Single-Wall Carbon Nanotube above Room Temperature. Nano Lett. 2006, 6 (1), 96-100.

Price, K. M.; Schauble, K. E.; McGuire, F. A.; Farmer, D. B.; Franklin, A. D. Uniform Growth of Sub-5-Nanometer High- K Dielectrics on MoS2 Using Plasma-Enhanced Atomic Layer Deposition. ACS Appl. Mater. Interfaces 2017, 9 (27), 23072-23080.

Pugliese, K. M.; Tolga Gul, O.; Choi, Y.; Olsen, T. J.; Sims, P. C.; Collins, P. G.; Weiss, G. A. Processive Incorporation of Deoxynucleoside Triphosphate Analogs by Single-Molecule DNA Polymerase i (Klenow Fragment) Nanocircuits. J. Am. Chem. Soc. 2015, 137 (30), 9587-9594.

Qi, P.; Vermesh, O.; Grecu, M.; Javey, A.; Wang, Q.; Dai, H.; Peng, S.; Cho, K. J. Toward Large Arrays of Multiplex Functionalized Carbon Nanotube Sensors for Highly Sensitive and Selective Molecular Detection. Nano Lett. 2003, 3 (3), 347-351.

Qiu, C.; Zhang, Z.; Xiao, M.; Yang, Y.; Zhong, D.; Peng, L. M. Scaling Carbon Nanotube Complementary Transistors to 5-Nm Gate Lengths. Science (80-.). 2017.

Qiu, H.; Xu, T.; Wang, Z.; Ren, W.; Nan, H.; Ni, Z.; Chen, Q.; Yuan, S.; Miao, F.; Song, F.; et al. Hopping Transport through Defect-Induced Localized States in Molybdenum Disulphide. Nat. Commun. 2013, 4.

Radisavljevic, B.; Radenovic, A.; Brivio, J.; Giacometti, V.; Kis, A. Single-Layer MoS2 Transistors. Nat. Nanotechnol. 2011, 6 (3), 147-150.

(56) References Cited

OTHER PUBLICATIONS

Rajan, N. K.; Routenberg, D. A.; Reed, M. A. Optimal Signal-to-Noise Ratio for Silicon Nanowire Biochemical Sensors. Appl. Phys. Lett. 2011, 98 (26), 1-4.

Rajesh; Sharma, V.; Puri, N. K.; Singh, R. K.; Biradar, A. M.; Mulchanadani, A. Label-Free Detection of Cardiac Troponin-I Using Gold Nanoparticles Functionalized Single-Walled Carbon Nanotubes Based Chemiresistive Biosensor. Appl. Phys. Lett. 2013, 103 (20), 203703.

Rodriguez, C.; Dietrich, P.; Torres-Costa, V.; Cebrián, V.; Gómez-Abad, C.; Díaz, A.; Ahumada, O.; Manso Silván, M. Near Ambient Pressure X-Ray Photoelectron Spectroscopy Monitoring of the Surface Immobilization Cascade on a Porous Silicon-Gold Nanoparticle FET Biosensor. Appl. Surf. Sci. 2019, 492, 362-368.

Rosenberger, M. R.; Chuang, H. J.; McCreary, K. M.; Hanbicki, A. T.; Sivaram, S. V.; Jonker, B. T. Nano-"Squeegee" for the Creation of Clean 2D Material Interfaces. ACS Appl. Mater. Interfaces 2018, 10 (12), 10379-10387.

Rowen, L.; Mahairas, G.; Hood, L. Sequencing the Human Genome. Science. American Association for the Advancement of Science Oct. 24, 1997, pp. 605-607.

Franklin, A. D.; Luisier, M.; Han, S. J.; Tulevski, G.; Breslin, C. M.; Gignac, L.; Lundstrom, M. S.; Haensch, W. Sub-10 Nm Carbon Nanotube Transistor. Nano Lett. 2012, 12 (2), 758-762.

Franklin, A. D.; Tulevski, G. S.; Han, S. J.; Shahrjerdi, D.; Cao, Q.; Chen, H. Y.; Wong, H. S. P.; Haensch, W. Variability in Carbon Nanotube Transistors: Improving Device-to-Device Consistency. ACS Nano 2012, 6 (2), 1109- 1115.

Fuller, C. W.; Kumar, S.; Porel, M.; Chien, M.; Bibillo, A.; Stranges, P. B.; Dorwart, M.; Chuanjuan, T.; Li, Z.; Guo, W.; et al. Real-Time, Single Molecule Electronic DNA Sequencing by Synthesis Using Polymer Tagged Nucleotides on a Nanopore Array. Proc Natl Acad Sci U S A 2016, In Press.

Fuller, E. J.; Pan, D.; Corso, B. L.; Gul, O. T.; Collins, P. G. Mean Free Paths in Single-Walled Carbon Nanotubes Measured by Kelvin Probe Force Microscopy. Phys. Rev. B 2014, 89 (24), 245450.

Fuller, E. J.; Pan, D.; Corso, B. L.; Tolga Gul, O.; Gomez, J. R.; Collins, P. G. Quantitative Kelvin Probe Force Microscopy of Current-Carrying Devices. Appl. Phys. Lett. 2013, 102 (8).

Fusco, L.; Gazzi, A.; Peng, G.; Shin, Y.; Vranic, S.; Bedognetti, D.; Vitale, F.; Yilmazer, A.; Feng, X.; Fadeel, B.; et al. Graphene and Other 2D Materials: A Multidisciplinary Analysis to Uncover the Hidden Potential as Cancer Theranostics. Theranostics 2020, 10 (12), 5435-5488.

Gao, X. P. A.; Zheng, G.; Lieber, C. M. Subthreshold Regime Has the Optimal Sensitivity for Nanowire FET Biosensors. Nano Lett. 2010, 10 (2), 547-552.

Goldsmith, B. R.; Coroneus, J. G.; Kane, A. A.; Weiss, G. A.; Collins, P. G. Monitoring Single-Molecule Reactivity on a Carbon Nanotube. Nano Lett. 2008, 8 (1), 189-194.

Gong, J. L.; Sarkar, T.; Badhulika, S.; Mulchandani, A. Label-Free Chemiresistive Biosensor for Mercury (II) Based on Single-Walled Carbon Nanotubes and Structure-Switching DNA. Appl. Phys. Lett. 2013, 102 (1), 013701.

Gou, P.; Kraut, N. D.; Feigel, I. M.; Bai, H.; Morgan, G. J.; Chen, Y.; Tang, Y.; Bocan, K.; Stachel, J.; Berger, L.; et al. Carbon Nanotube Chemiresistor for Wireless PH Sensing. Sci. Rep. 2014, 4 (1), 1-6.

Guo, X.; Huang, L.; O'Brien, S.; Kim, P.; Nuckolls, C. Directing and Sensing Changes in Molecular Conformation on Individual Carbon Nanotube Field Effect Transistors. J. Am. Chem. Soc. 2005, 127 (43), 15045-15047.

Guo, Y.; Wel, X.; Shu, J.; Liu, B.; Yin, J.; Guan, C.; Han, Y.; Gao, S.; Chen, Q. Charge Trapping at the MoS2—SIO2 Interface and Its Effects on the Characteristics of MoS2 Metal-Oxide-Semiconductor Field Effect Transistors. Appl. Phys. Lett. 2015, 106 (10).

Haustein, N.; Gutiérrez-Sanz, O.; Tarasov, A. Analytical Model to Describe the Effect of Polyethylene Glycol on Ionic Screening of Analyte Charges in Transistor-Based Immunosensing. ACS Sensors 2019, 4 (4), 874-882.

Helbling, T.; Hierold, C.; Roman, C.; Durrer, L.; Mattmann, M.; Bright, V. M. Long Term Investigations of Carbon Nanotube Transistors Encapsulated by Atomic-Layer-Deposited Al2O3 for Sensor Applications. Nanotechnology 2009, 20 (43), 434010.

Heller, L.; Janssens, A. M.; Mnnik, J.; Minot, E. D.; Lemay, S. G.; Dekker, C.; Ma, J. Identifying the Mechanism of Biosensing with Carbon Nanotube Transistors. Nano Lett. 2008, 8 (Dec. 2007), 591-595.

Her, M.; Beams, R.; Novotny, L. Graphene Transfer with Reduced Residue. Phys. Lett. Sect. A Gen. At. Solid State Phys. 2013, 377 (21-22), 1455-1458.

Herbschleb, E. D.; Puddy, R. K.; Marconcini, P.; Griffiths, J. P.; Jones, G. A. C.; Macucci, M .; Smith, C. G.; Connolly, M. R. Direct Imaging of Coherent Quantum Transport in Graphene P-n-p Junctions. Phys. Rev. B—Condens. Matter Mater. Phys. 2015, 92 (12).

Hills, G.; Lau, C.; Wright, A.; Fuller, S.; Bishop, M. D.; Srimani, T.; Kanhalya, P.; Ho, R.; Amer, A.; Stein, Y.; et al. Modern Microprocessor Built from Complementary Carbon Nanotube Transistors. Nature 2019, 572 (7771), 595-602.

Hodge, S. A.; Bayazit, M. K.; Coleman, K. S.; Shaffer, M. S. P. Unweaving the Rainbow: A Review of the Relationship between Single-Walled Carbon Nanotube Molecular Structures and Their Chemical Reactivity. Chem. Soc. Rev. 2012, 41 (12), 4409-4429.

Hong, S.; Myung, S. Nanotube Electronics: A Flexible Approach to Mobility. Nature Nanotechnology. Nature Publishing Group 2007, pp. 207-208.

Hu, L.; Hecht, D. S.; Gruner, G. Percolation in Transparent and Conducting Carbon Nanotube Networks. Nano Lett. 2004.

Hu, Y.; Zhou, J.; Yeh, P. H.; Li, Z.; Wel, T. Y.; Wang, Z. L. Supersensitive, Fast-Response Nanowire Sensors by Using Schottky Contacts. Adv. Mater. 2010, 22 (30), 3327-3332.

Huang, Y.; Qiao, J.; He, K.; Bliznakov, S.; Sutter, E.; Chen, X.; Luo, D.; Meng, F.; Su, D.; Decker, J.; et al. Interaction of Black Phosphorus with Oxygen and Water. Chem. Mater. 2016, 28 (22), 8330-8339.

Hunt, S. R.; Fuller, E. J.; Corso, B. L.; Collins, P. G. Distinguishing Carbon Nanotube Defect Chemistry Using Scanning Gate Spectroscopy. Phys. Rev. B—Condens. Matter Mater. Phys. 2012, 85 (23), 1-11.

Tacono, R.; Boyd, J. P. New Approximations to the Principal Real-Valued Branch of the Lambert W-Function. Adv. Comput. Math. 2017, 43 (6), 1403-1436.

Tijima, S.; Ichihashi, T. Single-Shell Carbon Nanotubes of 1-Nm Diameter. Nature 1993.

Islam, S.; Shukla, S.; Bajpai, V. K.; Han, Y. K.; Huh, Y. S.; Ghosh, A.; Gandhi, S. Microfluidic-Based Graphene Field Effect Transistor for Femtomolar Detection of Chlorpyrifos. Sci. Rep. 2019, 9 (1), 1-7.

Island, J. O.; Steele, G. A.; Van Der Zant, H. S. J.; Castellanos-Gomez, A. Environmental Instability of Few-Layer Black Phosphorus. 2D Mater. 2015, 2 (1).

Javey, A.; Guo, J.; Wang, Q.; Lundstrom, M.; Dal, H. Ballistic Carbon Nanotube Field-Effect Transistors. Nature 2003, 424 (6949), 654-657.

Jelbuldina, M.; Younes, H.; Saadat, I.; Tizani, L.; Sofela, S.; Ghaferi, A. Al. Fabrication and Design of CNTs Inkjet- Printed Based Micro FET Sensor for Sodium Chloride Scale Detection in Oil Field. Sensors Actuators, A Phys. 2017, 263, 349-356.

Jeun, M.; Lee, H. J.; Park, S.; Do, E. ju; Choi, J.; Sung, Y. N.; Hong, S. M.; Kim, S. Y.; Kim, D. H.; Kang, J. Y.; et al. A Novel Blood-Based Colorectal Cancer Diagnostic Technology Using Electrical Detection of Colon Cancer Secreted Protein-2. Adv. Sci. 2019, 6 (11), 1802115.

Kang, S. J.; Kocabas, C.; Ozel, T.; Shim, M.; Pimparkar, N.; Alam, M. A.; Rotkin, S. V.; Rogers, J. A. High- Performance Electronics Using Dense, Perfectly Aligned Arrays of Single-Walled Carbon Nanotubes. Nat. Nanotechnol. 2007, 2 (4), 230-236.

Karban, P.; Mach, F.; Küs, P.; Panek, D.; Doležel, I. Numerical Solution of Coupled Problems Using Code Agros2D. In Computing; Springer, 2013; vol. 95, pp. 381-408.

Kauffman, D. R.; Star, A. Carbon Nanotube Gas and Vapor Sensors. Angew. Chemie—Int. Ed. 2008, 47 (35), 6550-6570.

(56) References Cited

OTHER PUBLICATIONS

Keysight B2902A manual—Keysight Technologies B2900 Series Precision Source/Measure Unit (234 pages).
Kim, H. J.; Park, K. B.; Kang, J. H.; Lee, K.; Kim, H. M.; Kim, K. B. Detection of Metal Corrosion Characteristics in Chlorine Solution Using Solid State Nanopore. Nanotechnology 2019, 30 (22), 225501.
Kim, J. P.; Lee, B. Y.; Hong, S.; Sim, S. J. Ultrasensitive Carbon Nanotube-Based Biosensors Using Antibody-Binding Fragments. Anal. Biochem. 2008, 381 (2), 193-198.
Kim, J. P.; Lee, B. Y.; Lee, J.; Hong, S.; Sim, S. J. Enhancement of Sensitivity and Specificity by Surface Modification of Carbon Nanotubes in Diagnosis of Prostate Cancer Based on Carbon Nanotube Field Effect Transistors. Biosens. Bioelectron. 2009, 24 (11), 3372-3378.
Kim, K. S.; Lee, H. S.; Yang, J. A.; Jo, M. H.; Hahn, S. K. The Fabrication, Characterization and Application of Aptamer-Functionalized Si-Nanowire FET BIosensors. Nanotechnology 2009.
Kim, W.; Javey, A.; Vermesh, O.; Wang, Q.; Li, Y.; Dal, H. Hysteresis Caused by Water Molecules in Carbon Nanotube Field-Effect Transistors. Nano Lett. 2003, 3 (2), 193-198.
Kitamura, K.; Komatsu, M.; Biyani, M.; Futakami, M.; Kawakubo, T.; Yamamoto, K.; Nishigaki, K. Proven in Vitro Evolution of Protease Cathepsin E-Inhibitors and -Activators at PH 4.5 Using a Paired Peptide Method. J. Pept. Sci. 2012, 18 (12), 711-719.
Kocabas, C.; Kang, S. J.; Ozel, T.; Shim, M.; Rogers, J. A. Improved Synthesis of Aligned Arrays of Single-Walled Carbon Nanotubes and Their Implementation in Thin Film Type Transistors. J. Phys. Chem. C 2007, 111 (48), 17879-17886.
Kolodzey, J.; Chowdhury, E. A.; Adam, T. N.; Qui, G.; Rau, I.; Olowolafe, J. O.; Suehle, J. S.; Chen, Y. Electrical Conduction and Dielectric Breakdown in Aluminum Oxide Insulators on Silicon. IEEE Trans. Electron Devices 2000, 47 (1), 121-128.
Kreyling, W. G.; Semmler-Behnke, M.; Chaudhry, Q. A Complementary Definition of Nanomaterial. Nano Today 2010, 5 (3), 165-168.
Kupferschmidt, K.; Cohen, J. Race to Find COVID-19 Treatments Accelerates. Science. 2020.
Laird, E. A.; Kuemmeth, F.; Steele, G. A.; Grove-Rasmussen, K.; Nygård, J.; Flensberg, K.; Kouwenhoven, L. P. Quantum Transport in Carbon Nanotubes. Rev. Mod. Phys. 2015, 87 (3), 703.
Lee, J.; Dak, P.; Lee, Y.; Park, H.; Choi, W.; Alam, M. A.; Kim, S. Two-Dimensional Layered MoS2 Biosensors Enable Highly Sensitive Detection of Biomolecules. Sci. Rep. 2014, 4 (1), 1-7.
Lee, K.; Scardaci, V.; Kim, H. Y.; Hallam, T.; Nolan, H.; Bolf, B. E.; Maltbie, G. S.; Abbott, J. E.; Duesberg, G. S. Highly Sensitive, Transparent, and Flexible Gas Sensors Based on Gold Nanoparticle Decorated Carbon Nanotubes. Sensors Actuators, B Chem. 2013, 188, 571-575.
Lee, S. W.; Lee, S. Y.; Lim, S. C.; Kwon, Y. D.; Yoon, J. S.; Uh, K.; Lee, Y. H. Positive Gate Bias Stress Instability of Carbon Nanotube Thin Film Transistors. Appl. Phys. Lett. 2012, 101 (5), 053504.
Lee, S. W.; Suh, D.; Lee, S. Y.; Lee, Y. H. Passivation Effect on Gate-Bias Stress Instability of Carbon Nanotube Thin Film Transistors. Appl. Phys. Lett. 2014, 104 (16), 163506.
Sarkar, D.; Liu, W.; Xie, X.; Anselmo, A. C.; Mitragotri, S.; Banerjee, K. MoS2 Field-Effect Transistor for next- Generation Label-Free Biosensors. ACS Nano 2014, 8 (4), 3992-4003.
Schedin, F.; Geim, A. K.; Morozov, S. V.; Hill, E. W.; Blake, P.; Katsnelson, M. I.; Novoselov, K. S. Detection of Individual Gas Molecules Adsorbed on Graphene. Nat. Mater. 2007, 6 (9), 652-655.
Shekhar, S.; Erementchouk, M.; Leuenberger, M. N.; Khondaker, S. I. Correlated Electrical Breakdown in Arrays of High Density Aligned Carbon Nanotubes. Appl. Phys. Lett. 2011, 98 (24), 243121.
Shulaker, M. M.; Hills, G.; Patil, N.; Wei, H.; Chen, H. Y.; Wong, H. S.; Mitra, S. Carbon Nanotube Computer. Nature 2013, 501 (7468), 526-530.
Shulaker, M. M.; Wei, H.; Patil, N.; Provine, J.; Chen, H. Y.; Wong, H.- S. S. P.; Mitra, S. Linear Increases in Carbon Nanotube Density through Multiple Transfer Technique. Nano Lett. 2011, 11 (5), 1881-1886.
Silva, C.; Martins, M.; Jing, S.; Fu, J.; Cavaco-Paulo, A. Practical Insights on Enzyme Stabilization. Crit. Rev. Biotechnol. 2018, 38 (3), 335-350.
Silva, G. O.; Michael, Z. P.; Bian, L.; Shurin, G. V.; Mulato, M.; Shurin, M. R.; Star, A. Nanoelectronic Discrimination of Nonmalignant and Malignant Cells Using Nanotube Field-Effect Transistors. ACS Sensors 2017, 2 (8), 1128-1132.
Sims, P. C.; Moody, I. S.; Choi, Y.; Dong, C.; Iftikhar, M.; Corso, B. L.; Gul, O. T.; Collins, P. G.; Weiss, G. A. Electronic Measurements of Single-Molecule Catalysis by CAMP-Dependent Protein Kinase A. J. Am. Chem. Soc. 2013, 135 (21), 7861-7868.
Sinha, A.; Dhanjai; Tan, B.; Huang, Y.; Zhao, H.; Dang, X.; Chen, J.; Jain, R. MoS2 Nanostructures for Electrochemical Sensing of Multidisciplinary Targets: A Review. TrAC—Trends in Analytical Chemistry. Elsevier B.V. May 1, 2018, pp. 75-90.
Someya, T.; Small, J.; Kim, P.; Nuckolls, C.; Yardley, J. T. Alcohol Vapor Sensors Based on Single-Walled Carbon Nanotube Field Effect Transistors. Nano Lett. 2003, 3 (7), 877-881.
Soni, A.; Pandey, C. M.; Pandey, M. K.; Sumana, G. Highly Efficient Polyaniline-MoS2 Hybrid Nanostructures Based Biosensor for Cancer Biomarker Detection. Anal. Chim. Acta 2019, 1055, 26-35.
Sorgenfrei, S.; Chiu, C. Y.; Gonzalez Jr., R. L.; Yu, Y. J.; Kim, P.; Nuckolls, C.; Shepard, K. L. Label-Free Single-Molecule Detection of DNA-Hybridization Kinetics with a Carbon Nanotube Field-Effect Transistor. Nat Nanotechnol 2011, 6 (2), 126-132.
Star, A.; Gabriel, J. C. P.; Bradley, K.; Grüner, G. Electronic Detection of Specific Protein Binding Using Nanotube FET Devices. Nano Lett. 2003, 3 (4), 459-463.
Su, J.; Liu, Z. T.; Feng, L. P.; Li, N. Effect of Temperature on Thermal Properties of Monolayer MoS2 Sheet. J. Alloys Compd. 2015, 622, 777-782.
Syedmoradi, L.; Ahmadi, A.; Norton, M. L.; Omidfar, K. A Review on Nanomaterial-Based Field Effect Transistor Technology for Biomarker Detection. Microchimica Acta. Springer-Verlag Wien Nov. 1, 2019, pp. 1-23.
Tait, W. S. Electrochemical Corrosion Basics. In Handbook of Environmental Degradation Of Materials: Third Edition; Elsevier Inc., 2018; pp. 97-115.
Tang, X.; Bansaruntip, S.; Nakayama, N.; Yenilmez, E.; Chang, Y. I.; Wang, Q. Carbon Nanotube DNA Sensor and Sensing Mechanism. Nano Lett. 2006, 6 (8), 1632-1636.
Tans, S.; Verschueren, A.; Dekker, C. Room-Temperature Transistor Based on a Single Carbon Nanotube. Nature 1998, 672 (1989), 669-672.
Taupin, J. L.; Tian, Q.; Kedersha, N.; Robertson, M.; Anderson, P.; Li, Y.; Kim, W.; Utz, P. J.; Dai, H. The RNA-Binding Protein TIAR is Translocated from the Nucleus to the Cytoplasm during Fas-Mediated Apoptotic Cell Death. Proc. Natl. Acad. Sci. U. S. A. 1995, 92 (5), 1629-1633.
Tsormpatzoglou, A.; Papathanasiou, K.; Fasarakis, N.; Tassis, D. H.; Ghibaudo, G.; Dimitriadis, C. A. A Lambert-Function Charge-Based Methodology for Extracting Electrical Parameters of Nanoscale FinFETs. IEEE Trans. Electron Devices 2012, 59 (12), 3299-3305.
Tsuchikawa, R.; Heligman, D.; Blue, B. T.; Zhang, Z. Y.; Ahmadi, A.; Mucciolo, E. R.; Hone, J.; Ishigami, M. Scattering Strength of Potassium on a Carbon Nanotube with Known Chirality. Phys. Rev. B—Condens. Matter Mater. Phys. 2016, 94 (4), 1-5.
Tulevski, G. S.; Franklin, A. D.; Frank, D.; Lobez, J. M.; Cao, Q.; Park, H.; Afzali, A.; Han, S. J.; Hannon, J. B.; Haensch, W. Toward High-Performance Digital Logic Technology with Carbon Nanotubes. ACS Nano 2014, 8 (9), 8730-8745.
Tung, N. T.; Tue, P. T.; Thi Ngoc Lien, T.; Ohno, Y.; Maehashi, K.; Matsumoto, K.; Nishigaki, K.; Biyani, M.; Takamura, Y. Peptide Aptamer-Modified Single-Walled Carbon Nanotube-Based Transistors for High-Performance Biosensors. Sci. Rep. 2017, 7 (1), 1-9.
Van Thu, V.; Tam, P. D.; Dung, P. T. Rapid and Label-Free Detection of H5N1 Virus Using Carbon Nanotube Network Field Effect Transistor. Curr. Appl. Phys. 2013, 13 (7), 1311-1315.

(56) References Cited

OTHER PUBLICATIONS

Vikesland, P. J. Nanosensors for Water Quality Monitoring. Nat. Nanotechnol. 2018, 13 (8). 651-660.

Villamizar, R. A.; Maroto, A.; Rius, F. X.; Inza, I.; Figueras, M. J. Fast Detection of Salmonella Infantis with Carbon Nanotube Field Effect Transistors. Biosens. Bioelectron. 2008, 24 (2), 279-283.

Vollmer, F.; Arnold, S. Whispering-Gallery-Mode Biosensing: Label-Free Detection down to Single Molecules. Nat. Methods 2008, 5 (7), 591-596.

Wachter, S.; Polyushkin, D. K.; Bethge, O.; Mueller, T. A Microprocessor Based on a Two-Dimensional Semiconductor. Nat. Commun. 2017, 8 (1), 1-6.

Wang, D.; Yang, A.; Lan, T.; Fan, C.; Pan, J.; Liu, Z.; Chu, J.; Yuan, H.; Wang, X.; Rong, M.; et al. Tellurene Based Chemical Sensor. J. Mater. Chem. A 2019.

Wang, H.; Cobb, B.; Van Breemen, A.; Gelinck, G.; Bao, Z. Highly Stable Carbon Nanotube Top-Gate Transistors with Tunable Threshold Voltage. Adv. Mater. 2014, 26 (26), 4588-4593.

Wang, L.; Wang, Y.; Wong, J. I.; Palacios, T.; Kong, J.; Yang, H. Y. Functionalized MoS2 Nanosheet-Based Field- Effect Biosensor for Label-Free Sensitive Detection of Cancer Marker Proteins in Solution. Small 2014, 10 (6), 1101-1105.

Wen, W.; Song. Y.; Yan, X.; Zhu, C.; Du, D.; Wang, S.; Asiri, A. M.; Lin, Y. Recent Advances in Emerging 2D Nanomaterials for Blosensing and Bioimaging Applications. Materials Today. Elsevier B.V. Mar. 1, 2018, pp. 164-177.

White, C. T.; Todorov, T. N. Carbon Nanotubes as Long Ballistic Conductors. Nature 1998, 393 (6682), 240-241.

Wu, D.; Li, W .; Rai, A.; Wu, X.; Movva, H. C. P.; Yogeesh, M. N.; Chu, Z.; Banerjee, S. K.; Akinwande, D.; Lai, K. Visualization of Local Conductance in MoS2 /WSe2 Heterostructure Transistors. Nano Lett. 2019, 19 (3), 1976-1981.

Xia, M.; Cheng, Z.; Han, J.; Zhang, S. Extremely Stretchable All-Carbon-Nanotube Transistor on Flexible and Transparent Substrates. Appl. Phys. Lett. 2014, 105 (14), 143504.

Xie, J.; Zhang, H.; Li, S.; Wang, R.; Sun, X.; Zhou, M.; Zhou, J.; Lou, X. W.; Xie, Y. Defect-Rich MoS2 Ultrathin Nanosheets with Additional Active Edge Sites for Enhanced Electrocatalytic Hydrogen Evolution. Adv. Mater. 2013, 25 (40), 5807-5813.

Xie, X.; Jin, S. H.; Wahab, M. A.; Islam, A. E.; Zhang, C.; Du, F.; Seabron, E.; Lu, T.; Dunham, S. N.; Cheong, H. I.; et al. Microwave Purification of Large-Area Horizontally Aligned Arrays of Single-Walled Carbon Nanotubes. Nat. Commun. 2014.

Xu, X.; Clément, P.; Eklöf-Österberg, J.; Kelley-Loughnane, N.; Moth-Poulsen, K .; Chávez, J. L.; Palma, M. Reconfigurable Carbon Nanotube Multiplexed Sensing Devices, Nano Lett. 2018, 18 (7), 4130-4135.

Xuan, C. T.; Thuy, N. T.; Luyen, T. T.; Huyen, T. T. T.; Tuan, M. A. Carbon Nanotube Field-Effect Transistor for DNA Sensing. J. Electron. Mater. 2017, 46 (6), 3507-3511.

Yang, A.; Wang, D.; Wang, X.; Zhang, D.; Koratkar, N.; Rong, M. Recent Advances in Phosphorene as a Sensing Material. Nano Today. Elsevier B.V. Jun. 1, 2018, pp. 13-32.

Yang, F.; Wang, X.; Zhang, D.; Yang, J.; Luo, D.; Xu, Z.; Wel, J.; Wang, J.- Q.; Xu, Z.; Peng, F.; et al. Chirality-Specific Growth of Single-Walled Carbon Nanotubes on Solid Alloy Catalysts. Nature 2014, 510 (7506), 522-524.

Yang, N.; Chen, X.; Ren, T.; Zhang, P.; Yang, D. Carbon Nanotube Based Biosensors. Sensors Actuators, B Chem. 2015, 207 (PartA), 690-715.

Yang, Y.; Zeng, B.; Li, Y.; Liang, H.; Yang, Y.; Yuan, Q. Construction of MoS2 Field Effect Transistor Sensor Array for the Detection of Bladder Cancer Biomarkers. Sci. China Chem. 2020, 1-7.

Ye, P.; Ernst, T.; Khare, M. V. The Last Silicon Transistor: Nanosheet Devices Could Be the Final Evolutionary Step for Moore's Law. IEEE Spectr. 2019.

Zervas, M.; Sacchetto, D.; De Micheli, G.; Leblebici, Y. Top-down Fabrication of Very-High Density Vertically Stacked Silicon Nanowire Arrays with Low Temperature Budget. Microelectron. Eng. 2011, 88 (10), 3127-3132.

Zhang, J.; Boyd, A.; Tselev, A.; Paranjape, M.; Barbara, P. Mechanism of No. 2 Detection in Carbon Nanotube Field Effect Transistor Chemical Sensors. Appl. Phys. Lett. 2006, 88 (12).

Zhang, R. Q.; Lee, S. T.; Law, C. K.; Li, W. K.; Teo, B. K. Silicon Nanotubes: Why Not? Chem. Phys. Lett. 2002, 364 (3-4). 251-258.

Zhang, X. Y.; Zhang, L. D.; Meng, G. W.; Li, G. H.; Jin-Phillipp, N. Y.; Phillipp, F. Synthesis of Ordered Single Crystal Silicon Nanowire Arrays. Adv. Mater. 2001, 13 (16), 1238-1241.

Zhang, Y.; Brar, V. W.; Girit, C.; Zettl, A.; Crommie, M. F. Origin of Spatial Charge Inhomogeneity in Graphene. Nat. Phys. 2009, 5 (10), 722-726.

Zhang, Y.; Iijima, S. Elastic Response of Carbon Nanotube Bundles to Visible Light. Phys. Rev. Lett. 1999, 82 (17), 3472-3475.

\* cited by examiner

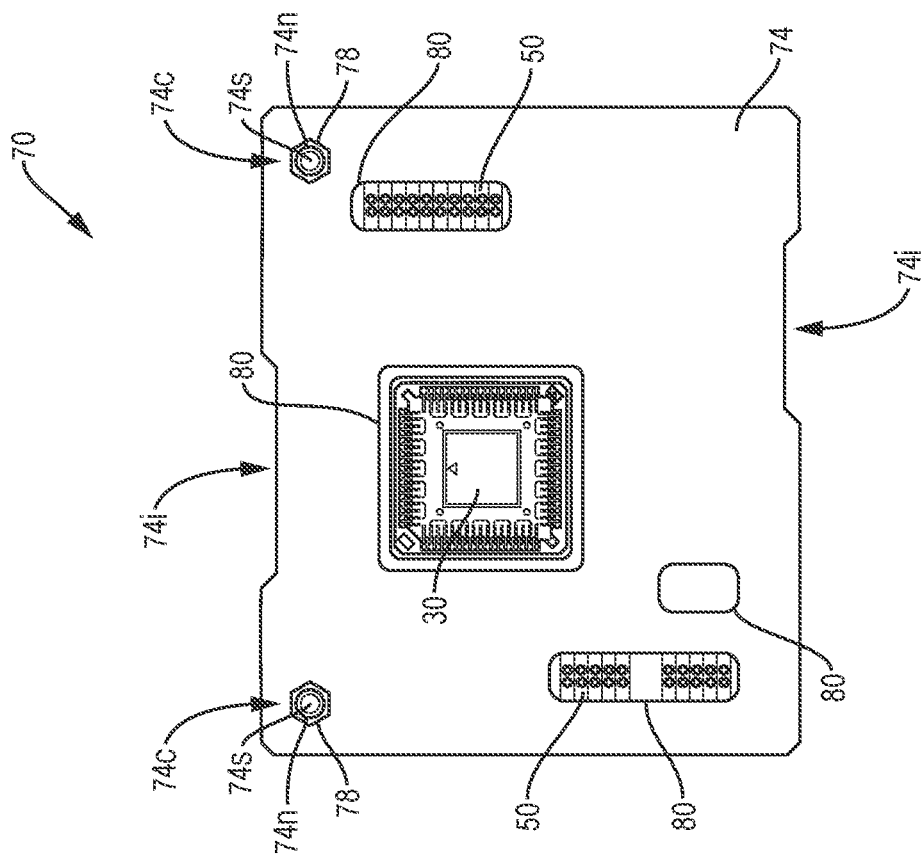
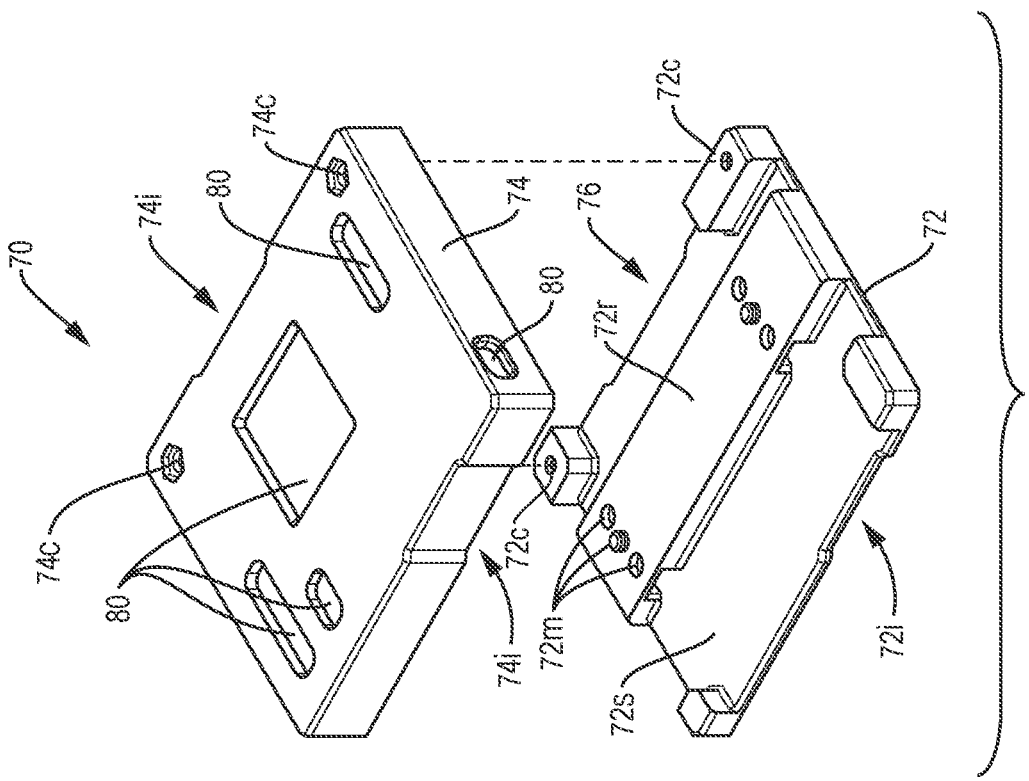
FIG. 5B
FIG. 5A

ELECTRONIC DEVICE CHARACTERIZATION SYSTEMS AND METHODS

CROSS REFERENCE TO RELATED APPLICATION

The present disclosure claims priority to and the benefit of U.S. Provisional Patent Application No. 63/122,089, entitled "ELECTRONIC DEVICE CHARACTERIZATION SYSTEM AND PLATFORM," filed on Dec. 7, 2020, the disclosure of which is incorporated by reference herein in its entirety.

FEDERAL FUNDING LEGEND

This invention was made with Government support under Federal Grant no. 1R01HL146849 awarded by the National Institutes of Health. The Federal Government has certain rights to this invention.

FIELD

The present disclosure relates to systems, devices, and methods for making electronic characterizations of devices and sensors, and more particularly relates to a portable, versatile, and high-throughput system for performing such characterizations, and methods related to operating the same.

BACKGROUND

Sensors have become an integral part of society, taking measurements that inform increasingly data-driven decisions, illuminating processes that further fundamental research, and feed input into rapidly improving machine learning algorithms. Chemical sensors in particular are relied upon to diagnose disease, monitor the quality of drinking water, ensure the safety of food before shipment, track the glucose levels in diabetic patients, and numerous other critical functions. Related to the same, for research and experimental scientists and engineers, the ability to control and monitor instrument and sensor performance can be critical to scientific progress. It is important that the instruments being used by such scientists and engineers are precise and, ideally, can provide a high throughput. As such instruments, which can include electronic devices and sensors, are built, created, and invented, it can be just as important to provide systems and methods capable of assessing the performance of the instruments.

More particularly, the design of novel electronic devices and sensors requires a macroscale platform that can characterize the devices or record sensor readings in various controlled environments and report the measured data to computers or smartphones for analysis, storage, and visualization. While there are some existing solutions, such as source measuring units (SMUs), semiconductor parameter analyzers, and benchtop stations, many have inherent tradeoffs. For example, some solutions are capable of only limited measurements that cannot provide a powering voltage. As a results, at least some existing measurement devices lack the ability to test multiple devices or sensors simultaneously and/or in any sort of efficient manner. Other solutions include large, expensive benchtop stations with delicate components and limitations in terms of throughput, configurability, and environmental conditions during testing (e.g., light exposure, liquid environment). For instance, when using a large benchtop station, typically a user has to manipulate various probes for each measurement to be taken, and it is a time-consuming process to perform various tests, let alone confirm the accuracy of those tests with follow-on tests if desired. Such stations also can be cumbersome to configure for various desired uses. By way of further example, at least some existing measurement devices are not capable of operating and/or communicating from within a vacuum environment. Additional limitations of existing systems are highlighted below in comparing them to the systems and methods that comprise the present disclosure.

Accordingly, there is an ongoing need for improved systems and methods to characterize or otherwise assess electronic devices and sensors.

SUMMARY

The Summary is provided to introduce a selection of concepts that are further described below in the Detailed Description. This Summary is not intended to identify key or essential features of the claimed subject matter, nor is it intended to be used as an aid in limiting the scope of the claimed subject matter.

In one exemplary embodiment an electronic device characterization system, the system includes a circuit board, a chip adapter coupled to the circuit board, and one or more environmental module mounts. The environmental module mounts are configured to selectively place one of a plurality of environmental modules over the chip adapter (e.g., chip socket) to allow the environmental module to provide a desired environment to the chip sample being tested.

In some embodiments, the system can further include a housing that defines a chamber. The housing can include a plurality of openings formed in it to provide access to the chamber. The circuit board can be disposed in the chamber, and a first opening of the plurality of openings can provide access to the chip adapter.

The system can include one or more interfacing connectors. The interfacing connectors can be configured to receive one or more external communication devices to enable the system to communicate with, for example, a computer. In embodiments that include both an interfacing connector(s) and the above-described housing, another opening of the plurality of openings can provide access to at least one interfacing connector of the one or more interfacing connectors.

The system can include one or more external communication devices configured to provide data communication with a computer. Alternatively, or additionally, the system can include one or more modular connectors configured to receive one or more expansion modules to provide additional testing capabilities to the system. In embodiments that include both a modular connector(s) and the above-described housing, another opening of the plurality of openings can provide access to at least one modular connector of the one or more modular connectors.

In some embodiments, the system can include one or more expansion modules. The expansion modules can be configured to provide various capabilities, including but not limited to additional testing capabilities, data communication capabilities, and/or environment capabilities. The system can include a plurality of environmental modules. Such modules can be configured to be at least one of coupled to or disposed above the circuit board by way of the one or more environmental module mounts. Each environmental module of the plurality of environmental modules can be configured to provide a prescribed environment to the chip sample being tested. In some such embodiments, the prescribed environment of at least one environmental module of the plurality of environmental modules is a vacuum environment.

The system can further include programmable analog circuitry disposed on the circuit board. The circuitry can include, for example, the following components, some or all of which can be in electrical communication with each other and/or with the chip adapter: one or more analog multiplexers; one or more digital-to-analog converters; one or more transimpedance amplifiers; one or more analog-to-digital converters; one or more processors; and/or one or more analog switches disposed between at least two or the one or more analog multiplexers, digital-to-analog converters, transimpedance amplifiers, analog-to-digital converters, or processors. In some instances, rather than a plurality of one or more of these components, only one component is provided.

One exemplary method of electronically characterizing a device or sensor includes disposing a chip sample in a chip adapter (e.g., a chip socket) coupled to a circuit board, providing a first prescribed environment to the chip sample disposed in the chip adapter by way of a first environment module. The method further includes performing a first electronic characterization test of the chip sample while the chip sample is exposed to the first prescribed environment, and removing the first prescribed environment away from the chip sample. Still further, the method includes providing a second prescribed environment to the chip sample disposed in the chip adapter by way of a second environment module and performing a second electronic characterization test of the chip sample while the chip sample is exposed to the second prescribed environment. The results from the first and second electronic characterization tests are communicated to an outside source. The circuit board is provided as a standalone component such that the actions of providing the first and second prescribed environments are performed in rapid succession.

In some embodiments the circuit board and the chip adapter can be disposed within a portable housing such that the actions pf performing the first and second electronic characterization tests are performed using a portable, handheld system. In some such embodiments, providing a first prescribed environment to the chip sample disposed in the chip adapter by way of a first environment module can include coupling the first environment to the portable housing such that at least a portion of the first environment module is disposed above the chip adapter. Likewise, providing a second prescribed environment to the chip sample disposed in the chip adapter by way of a second environment module can include coupling the second environment module to the portable housing such that at least a portion of the second environment module is disposed above the chip adapter.

The method can include at least one of coupling one or more external communication devices to the circuit board or disposing the one or more external communication devices above the chip adapter. In such embodiments, communicating results from the first and second electronic characterization tests to an outside source can include operating the one or more external communication devices to communicate the results from the first and second characterization tests to an outside source.

The method can include coupling one or more expansion modules to the circuit board or disposing the one or more expansion modules above the chip adapter. In such embodiments, the method can further include performing a third electronic characterization test using the one or more expansion modules. The third electronic characterization test can be performed simultaneously, or approximately near simultaneously, with at least one of the first electronic characterization test and the second electronic characterization test.

In some embodiments at least one of the first and second prescribed environments can be a vacuum environment. The actions of performing the first and second electronic characterization tests can be automated. The circuit board can include programmable analog circuitry disposed on it. The programmable analog circuitry can include, for example, the following components, some or all of which can be in electrical communication with each other and/or with the chip adapter: a plurality of analog multiplexers; a plurality of digital-to-analog converters; a plurality of transimpedance amplifiers; a plurality of analog-to-digital converters; and/or a plurality of processors. In some instances, rather than a plurality of one or more of these components, only one component is provided.

BRIEF DESCRIPTION OF THE DRAWINGS

The accompanying Figures are provided by way of illustration and not by way of limitation. The foregoing aspects and other features of the disclosure are explained in the following description, taken in connection with the accompanying example figures (also "FIG.") relating to one or more embodiments:

FIG. 5A is an exploded view of one exemplary embodiment of a housing for use in conjunction with or as part of a characterization system, like the system of FIG. 1A;

FIG. 5B is a top view of the characterization system of FIG. 1A disposed within the housing of FIG. 5A;

DETAILED DESCRIPTION

Figure 1B:
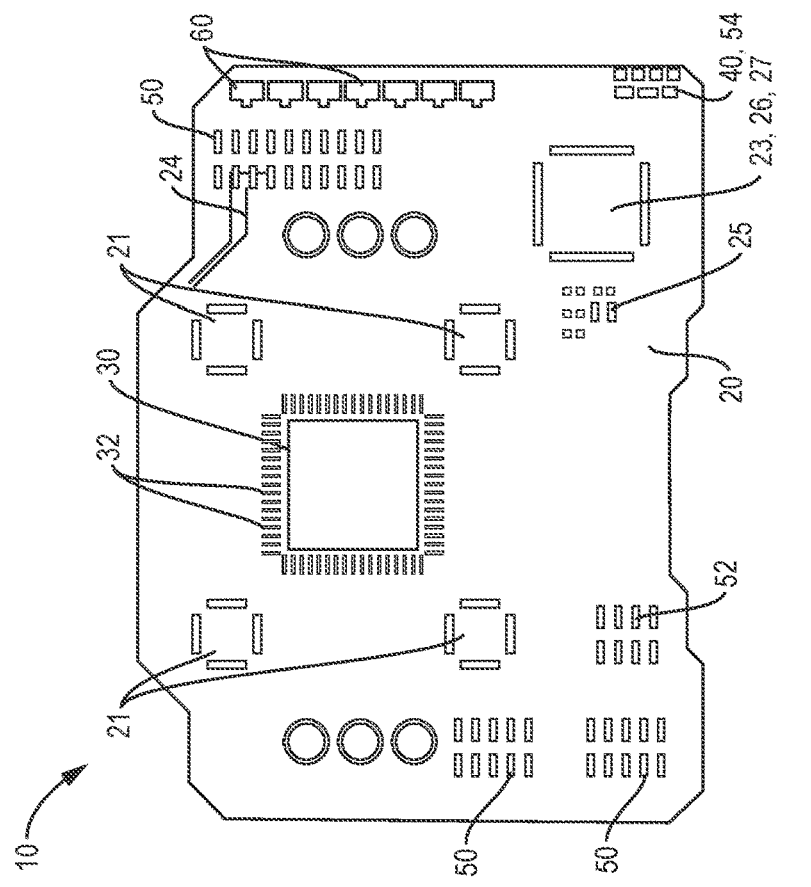
FIG. 1B is a schematic top view of the characterization system of FIG. 1A, presented in a manner to illustrate the four-layer design of the system.

Certain exemplary embodiments will now be described to provide an overall understanding of the principles of the structure, function, manufacture, and use of the devices and methods disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present disclosure is defined solely by the claims. The features illustrated or described in connection with one exemplary embodiment may be combined with the features of other embodiments. Such modifications and variations are intended to be included within the scope of the present disclosure.

Articles "a" and "an" are used herein to refer to one or to more than one (i.e., at least one) of the grammatical object of the article. By way of example, "an element" means at least one element and can include more than one element. "About" is used to provide flexibility to a numerical range endpoint by providing that a given value may be "slightly above" or "slightly below" the endpoint without affecting the desired result. The use herein of the terms "including," "comprising," or "having," and variations thereof, is meant to encompass the elements listed thereafter and equivalents thereof as well as additional elements. As used herein, "and/or" refers to and encompasses any and all possible combinations of one or more of the associated listed items, as well as the lack of combinations where interpreted in the alternative ("or").

Moreover, the present disclosure also contemplates that in some embodiments, any feature or combination of features set forth herein can be excluded or omitted. To illustrate, if the specification states that a complex comprises components A, B and C, it is specifically intended that any of A, B, or C, or a combination thereof, can be omitted and disclaimed singularly or in any combination. Similarly, to the extent features or steps are described herein as being a "first feature" or "first step," or a "second feature" or "second step," such numerical ordering is generally arbitrary, and thus such numbering can be interchangeable. Moreover, a person skilled in the art will appreciate that not all of the method steps disclosed herein are required, and, in view of the present disclosure, will understand how modifications can be made to each step, the order of the steps, the limitation of certain steps, etc. without departing from the spirit of the present disclosure while still achieving the desired goals.

Recitation of ranges of values herein are merely intended to serve as a shorthand method of referring individually to each separate value falling within the range, unless otherwise indicated herein, and each separate value is incorporated into the specification as if it were individually recited herein. For example, if a concentration range is stated as approximately in the range of about 1% to about 50%, it is intended that values such as approximately in the range of about 2% to about 40%, approximately in the range of about 10% to about 30%, or approximately in the range of about 1% to about 3%, etc., are expressly enumerated in this specification. These are only examples of what is specifically intended, and all possible combinations of numerical values between and including the lowest value and the highest value enumerated are to be considered to be expressly stated in this disclosure, as are values slightly above and/or slightly below those ranges at least in instances in which the term "about" is used. A number of terms may be used throughout the disclosure interchangeably but will be understood by a person skilled in the art. By way of non-limiting example, the terms "connectors" and "ports" may be used interchangeably, as well as the terms "chip" and "chip sample."

Unless otherwise defined, all technical terms used herein have the same meaning as commonly understood by one of ordinary skill in the art to which this disclosure belongs. Additionally, like-numbered components across embodiments generally have similar features unless otherwise stated or a person skilled in the art would appreciate differences based on the present disclosure and his/her knowledge. Accordingly, aspects and features of every embodiment may not be described with respect to each embodiment, but those aspects and features are applicable to the various embodiments unless statements or understandings are to the contrary.

In the development of new electronic devices and sensors, it is useful to perform a variety of electrical and environmental tests to characterize the parameters of the devices. These parameters include, but are not limited to, electrical characterizations such as resistivity, carrier concentration, mobility, contact resistance, barrier height, depletion width, oxide charge, interface states, carrier lifetimes, and/or deep level impurities, and/or mapping of signal-to-noise ratios in certain environments (e.g., a liquid environment). While there are some conventional characterization systems that are designed for laboratory research environments, such as source measurement units (SMUs) and semiconductor parameter analyzers, these systems have several drawbacks. For example, one typical approach is a probe station with a microscope and micromanipulator probes that position the probe onto contact pad structures to form electrical contacts to the device under test. Probe systems can be expensive, bulky, and sensitive to disruptions. Further, these systems typically have a low throughput, with test stations dedicated to a single device and/or test. This can lead to a high cost for each type of test, as well as an inability to run the same test on a device under different conditions and environments. The present disclosure addresses these and other challenges by providing a portable measurement unit that is capable of performing high-resolution electrical measurements on dozens of simultaneously connected devices or sensors and streaming those readings to a computer. The tests can be performed simultaneous, or near simultaneous (within a matter of seconds, or even less time).

Figure 1A:
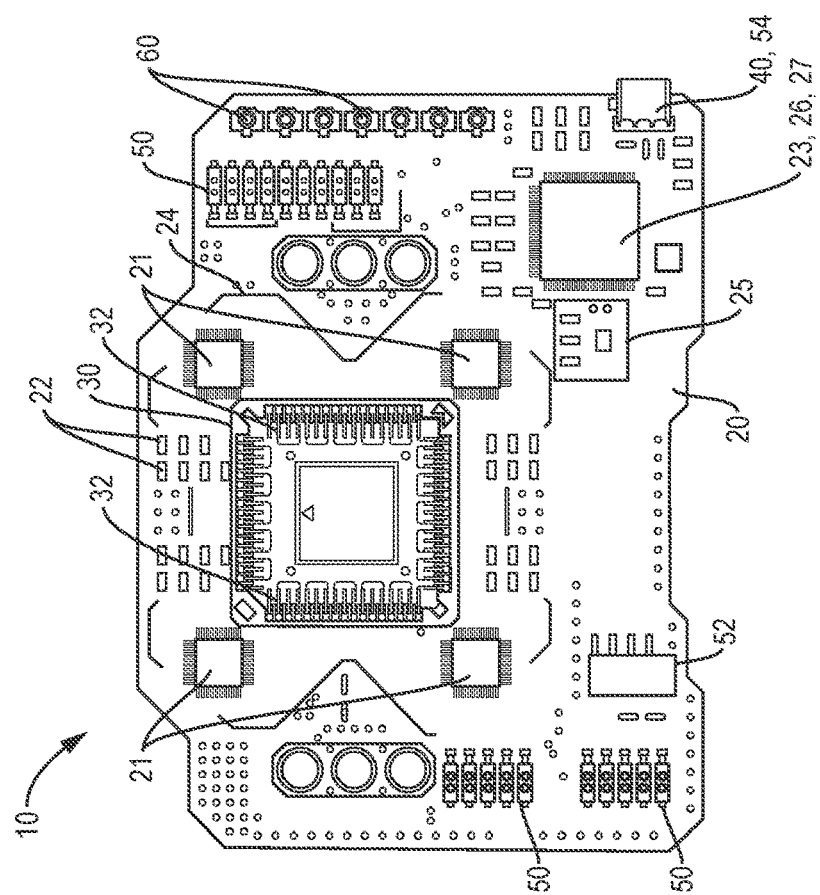
FIG. 1A is a top view of one exemplary embodiment of a characterization system of the present disclosure.
Figure 1C:
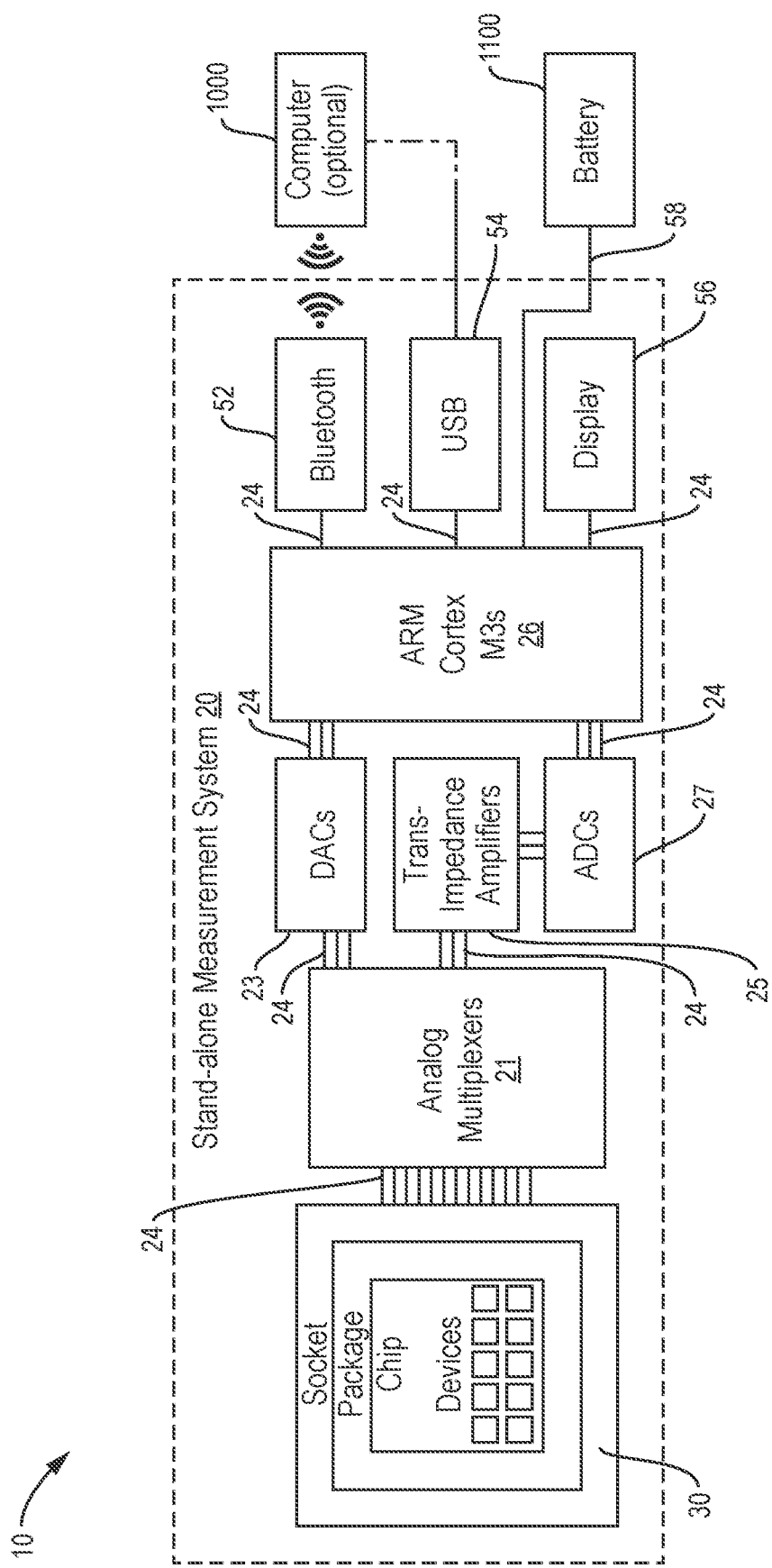
FIG. 1C is an electrical circuitry block diagram illustrating various components and interfaces of the characterization system of FIG. 1A.

An example embodiment of a characterization system 10, sometimes referred to as a measurement platform, is illustrated in FIGS. 1A, 1B, and 1C. The system 10 comprises at least a circuit board or substrate 20 and a chip adapter 30, as shown a chip socket, mounted to the circuit board 20. Additionally, the system 10 can include independent test leads 22 and wiring 24 formed on the circuit board 20, a power connection and/or a power source 40, as well as interfacing components or connectors 50 for interfacing with external systems (e.g., standard micro-USB, Bluetooth interfaces, etc.), sometimes referred to as external communication devices. Still further, one or more of the following components can be incorporated as part of and/or be connected to the circuit board 20: analog multiplexers 21, digital-to-analog converters (DACs) 23, transimpedance amplifiers (TIAs) 25, analog-to-digital converters (ADCs) 27, processors (e.g., ARM Cortex M3s) 26 (in the illustrated embodiment, the DACs, ADCs, and processors are group together in a single location, although other configurations are possible), a Bluetooth chip or connector 52, a USB port 54 (which in the illustrated embodiment doubles as the power source or power connection for a power source 40), and a display 56. The multiplexers 21, DACs 23, TIAs 25, ADCs 27, and processors 26 are components that provide functionality understood by those skilled in the art, and thus further explanation of their functionality and purpose is unnecessary. More particularly, at least with respect to the processors 26, ARM Cortex M3 processors can include analog switches disposed on or otherwise associated with the processors 26. Alternatively, or additionally, one or more analog switches can be included as part of the analog circuitry, not necessarily because they are part of the provided processors. The switches can be digitally controlled. In the illustrated embodiment, analog switches are disposed on both the multiplexers 21 and the processors 26, although in other embodiments they can be disposed on none or one of those elements and/or can otherwise be operable with respect to those elements, as well as others provided for in the circuitry. Such switches can typically be inserted between analog components of the circuitry though. For example, the illustration of the wiring 24 in FIG. 1C can further constitute at least one analog switch disposed in place of, or in conjunction with, the wiring 24. That is, wiring 24 may include and/or may be replaced by one or more analog switches, as would be understood by a person skilled in the art in view of the present disclosures. To the extent more traditional characterization systems, or other devices, use analog switches, the analog components associated with the switches have their analog components wired together directly in a manner that makes those connections permanent. In contrast, the analog switches of the present disclosure are part of a configuration in which analog components are wired together with analog switches in-between. As a result, the connections can be turned on and off to reconfigure the behavior of the system 10.

The diagram of FIG. 1C illustrates one, non-limiting embodiment of how these components can be electrically connected on the circuit board 20, but other configurations are possible. While the individual components of the circuitry may be known and their functionality understood, the particular configuration disclosed herein utilizes programmable analog circuitry, which is different than conventional monolithic and static circuitry for similar devices. This programmable analog circuitry allows for connections between analog components to be initiated, dropped, and/or rerouted at runtime. Efficient use of this feature enables the measurement platform to perform widely disparate actions at different points in time, allowing it to take on the roles of multiple traditional instruments. This large degree of configurability and flexibility both enables and complements the modularity of the system as a whole, allowing tight integration between many measurement capabilities. This degree of integration facilitates automation by allowing functions that would traditionally be located on different instruments to be tightly bound and centrally controlled. A battery 1100 or other power source can supply power to the processor(s) 26 as shown. The Bluetooth chip 52 and USB port 54, non-limiting examples of external communication devices, provide the ability to transmit data and information to a computer 1000 or other similar type device, as described in further detail below, and the display 56 can allow measured parameters or other information about the system 10 to be displayed and/or can be linked to an output display for further visual communication of such parameters and/or information. The computer 1000 can also supply power to the system 10 if desired. The system optionally includes additional connectors 60 for modular add-on functionality, which is described in further detail below.

In an example embodiment, the chip adapter 30 can be any suitable type of conventional or custom socket or adapter that facilitates electrical contact between the measurement system and samples to be tested, such as a plastic leaded chip socket. Other types of non-socket adapters are also possible. More generally, the chip adapter 30 provides an interface with the chip that is directly part the system 10. A plurality of electronic devices and/or sensors 110 to be characterized can be mounted on a substrate 120 to form a chip sample 100 (see FIG. 2), which can be inserted into the socket 30 (see FIGS. 7-10). A chip sample can include a single electronic device or sensor to be analyzed, or it can include a plurality of electronic devices or sensors to be analyzed with all devices or sensors addressed by electrical connection to pins in the socket. In the example embodiment of FIG. 1A, the socket 30 is a 68-pin socket. However, it is to be understood that the socket can be any suitable type, shape, and/or size (e.g., rectangular or square, 4-1000 pins, etc.). The socket 30 can be integrated with the circuit board 20 using any techniques known to those skilled in the art, including but not limited to soldering the socket 30 to the circuit board 20. In some embodiments, a cover (e.g., clear, acrylic cover) can be disposed over the socket 30 to prevent solution evaporation during long-term testing.

Each mounted device 110 can be electrically connected to one or more peripheral pins 32 of the chip socket 30. Thus, the characterization system 10 can advantageously test multiple electronic devices 110, or multiple chip samples 100 more generally, at once using a robust handling and connection method. FIGS. 7-10 illustrate instances in which the chip sample 100 is disposed in the chip socket 30. The chip socket 30 can be adapted to receive, such as by having the electronic device disposed in it or otherwise coupled to the chip socket 30, such that multiple device, or multiple types of devices can be analyzed by the system 10. Having this robust connection can be particularly advantageous for long-duration tests where it can be crucial that the connection between the electronic device(s) 110 and the characterization system 10 is not interrupted midway through the test (as compared to conventional systems, in which probes may suffer loss of connection due to, for example, bumps, mechanical vibration, etc.). Another advantage is that it is possible to simultaneously conduct, or near simultaneously (within a few seconds, or even less) different types of tests with varying duration, in series or parallel, all using the same system 10.

The number of devices 110 that can be mounted to the characterization system 10 at once can depend on several factors, including by not limited to the type of device(s) being tested, the number of pins designated for each device, the number of shared pins, the number of interfacing connectors 50 included as part of the system 10, etc. The circuit board 20 can be correspondingly configured to provide circuitry to the socket 30 to perform the prescribed testing for the given device 110 and/or chip sample(s) 100.

Figure 2:
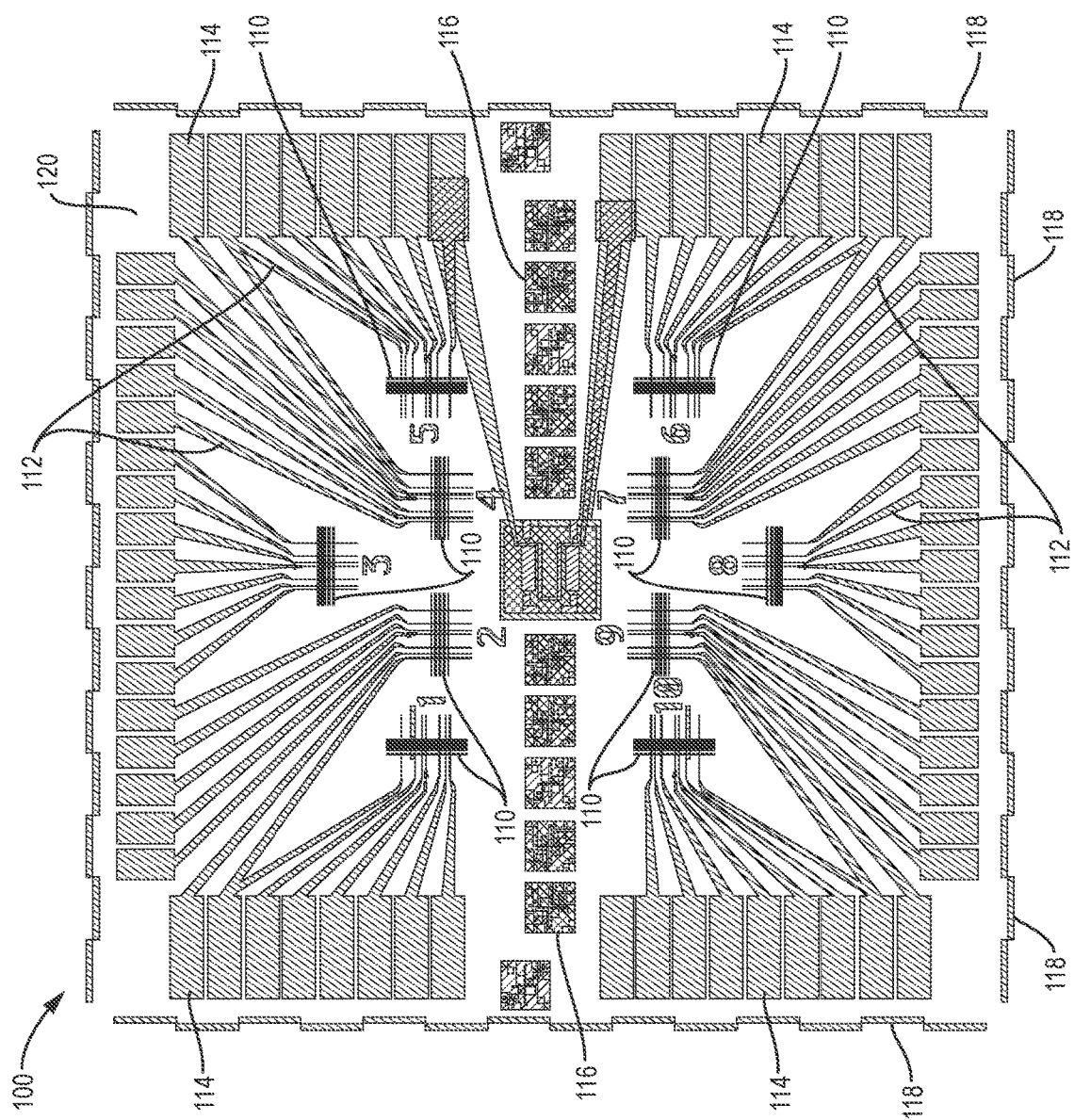
FIG. 2 is an electrical circuitry diagram illustrating one exemplary embodiment of a chip sample layout that can be used in conjunction with the characterization systems of the present disclosure, including the characterization system of FIG. 1A.

FIG. 2 provides for one non-limiting embodiment of a chip sample 100 having a plurality of devices or sensors 110 disposed thereon. In the illustrated embodiment, the devices 110 are coupled to the substrate 120. In some embodiments, the on-chip electrical connection for the chip sample(s) 100 can be established by wire-bonding the devices 110 to the chip sample 100. More particularly, in the illustrated embodiment, a plurality of devices 110, as shown ten (10) devices, are disposed on the substrate 120. Each device 110 has one or more contact leads 112 electrically coupled therewith, and the lead(s) 112 can extend to one or more contact pads 114. One or more of the pads 114 can then engage with one or more of the pins 32 of the chip socket 30 to connect the chip sample 100 to the system 10 for purposes of testing the devices 110 on the chip sample 100. A plurality of layer alignment marks 116 can be formed on substrate 120, which can assist in facilitating alignment between processing steps and layers during fabrication of the chip sample 100. A chip boundary 118 can be formed along an outside perimeter of the substrate 120, which can demarcate where the edge of the chip sample 100 is located. The chip boundary 118 can also be used to assist in facilitating alignment, such as to align a cutting process that separates chips from a wafer. By way of non-limiting embodiment, in some embodiments the electronic devices 110 to be characterized are carbon nanotube (CNT) field-effect transistors. A person skilled in the art will appreciate many different devices and/or sensors that can be incorporated into the chip sample 100, or across multiple chip samples. Those devices and/or sensors can be similar such that multiple of the same devices or sensors are being tested simultaneously or in rapid succession, or they can be different such that multiple types of devices and/or sensors are being tested simultaneously or in rapid succession.

In at least some embodiments the chip sample 100 can be inserted into a chip carrier or chip package, and then the chip carrier or chip package can be inserted into the chip adapter 30. That is, the chip carrier or chip package provides an interface that allows the chip or chip sample 100 to interface with the chip adapter 30. In other embodiments, however, it is contemplated that no chip carrier or chip package is provided and, instead, the chip sample 100 can interface directly with the chip adapter 30, and thus the system 10.

In alternative embodiments, the sample, device(s), and/or sensor(s) being tested do not necessarily need to be a chip. Further, while chip sample 100 may often be a silicon chip at least because silicon is a common substrate material for devices that would typically be tested in a characterization system like the system 10, other materials can also be used. By way of non-limiting example, devices (e.g., devices 110) can be tested by being disposed on other substrates, such as one or more pieces of Kapton polyimide.

While FIGS. 2 and 7-10 only illustrate one type of chip sample 100, the illustrated system 10, as well as other systems provided for herein or otherwise derivable from the present disclosures, enable measurements to be made on dozens (or more) of simultaneously connected devices or sensors, i.e., chip samples. For example, in other embodiments, the system 10 can include multiple chip samples 30. That is, the present disclosure enables an automated experimentation platform that provides for tight synchronization between characterization instruments so that each variable that impacts device sensitivity can be controlled and measured in tandem, in some cases for months on end.

Each characterization system 10, as well as other systems provided for herein or otherwise derivable from the present disclosures, can have a core set of features or parameters that can be measured or otherwise monitored. Some non-limiting example features include voltage sourcing, current measurement, chip interfacing, multiplexing, resistivity, carrier concentration, mobility, contact resistance, barrier height, depletion width, oxide charge, interface states, carrier lifetimes, deep level impurities, and/or mapping of signal-to-noise ratios in certain environments (e.g., a liquid environment). The sensed or measured parameters can constitute high-resolution electrical measurements. According to one non-limiting example embodiment, the system 10 is capable of supplying a range of both positive and negative voltages while measuring currents as high as approximately 50 µA and as low as approximately 50 pA. More generally, the system 10 can be an integrated measurement electronics board capable of measuring currents approximately in the range of about 50 pA to about 10 A. A person skilled in the art, in view of the present disclosures, will appreciate that sensing ranges can be expanded, for example, by using different DACs and/or TIAs, among other components of the system 10, which can lead to being able to measure currents approximately in the range of about 1 fA to about 10 A. Those ranges may even be able to be further expanded on either end of the range. The system 10 can have a current measurement dynamic range of greater than six orders of magnitude, multiplexing across all possible combinations of 64 independent test leads or pads 22, simultaneously measuring current at two device terminals, and rapidly switching between devices measured. For example, in the illustrated embodiment, approximately sixteen devices can be tested per minute with 100 points per device. In contrast, a skilled operator of existing benchtop probe station equipment would struggle to measure more than one device per minute, meaning that an entire chip of 64 devices would require over an hour of intense concentration. This can cause and/or incentivize the operator to skip one or more devices. The illustrated embodiment, on the other hand, provides no such skipping incentive because the entire chip can be measured unattended in mere minutes. Common test types performed on the system 10 include collection of subthreshold curves, transfer curves, sensor signal-to-noise ratio (SNR) dependence on operating voltages, charge-trap equilibration rates, and device electrical characteristics during in-situ microscopy. Measured parameters can be communicated to computers, smartphones, or other electronic devices capable of receiving and/or analyzing data, thereby allowing the measured parameters to be analyzed, stored, and/or visualized. The communication can be achieved using any techniques or systems known for being able to transmit data, including but not limited to data transmission by way of standard micro-USB, USB, optical, Bluetooth, and other wired and/or wireless interfaces.

The system 10 can be manufactured using a variety of techniques known to those skilled in the art for forming, printing, or otherwise creating or building circuit boards and related components. As shown in FIG. 1B, the system 10 includes a four-layer design, with each layer being designated by a different shade. A first layer includes the circuit board 20 itself, a second layer includes the leads 22, a third layer includes electrical components (e.g., wires) 24 that allow for the communication across the circuit board 20, and a fourth layer includes attachments, such as the chip socket 30. Notably, the described layers are not necessarily manufactured or placed in that numeric order. For example, the second layer that includes the leads 22 may extend further away from the circuit board 20 than the identified third layer that include the electrical components 24. A footprint of the system circuit board 20, and thus the system 10 as illustrated, can be approximately in the range of about 1 inch to about 10 inches in length, approximately in the range of about 1 inch to about 10 inches in width, and approximately in the range of about 0.1 inches to about 5 inches in height, although other sizes are possible depending, at least in part, on the intended use of the system 10, the sizes and shapes of components of the system 10 and with which the system 10 will be used, and the preferences of the user. In one, non-limiting exemplary embodiment, the system 10 is about 4.25 inches in length by about 3.25 inches in width by about 0.5 inches in height. The size can generally be of the nature that the provided system 10 is portable for ease of use while still providing accuracy, high-resolution measurements. In general, the location of the various components associated with the circuit board 20 is not critical, though generally the chip socket 30 is disposed on the surface of the circuit board 20 to enable easy access for receiving a chip sample to test.

In addition to the core set of features on the main circuit board 20 of the system 10, the system 10 can have additional connection ports 60 for modular add-on expansion boards. The expansion boards can enable a variety of additional features, such as operation on battery power for increased portability, and/or coaxial signal ports for connection to conventional laboratory benchtop measurement equipment. Some non-limiting example modules are shown in FIGS. 3A, 3B, 4A, and 4B.

Figure 3A:
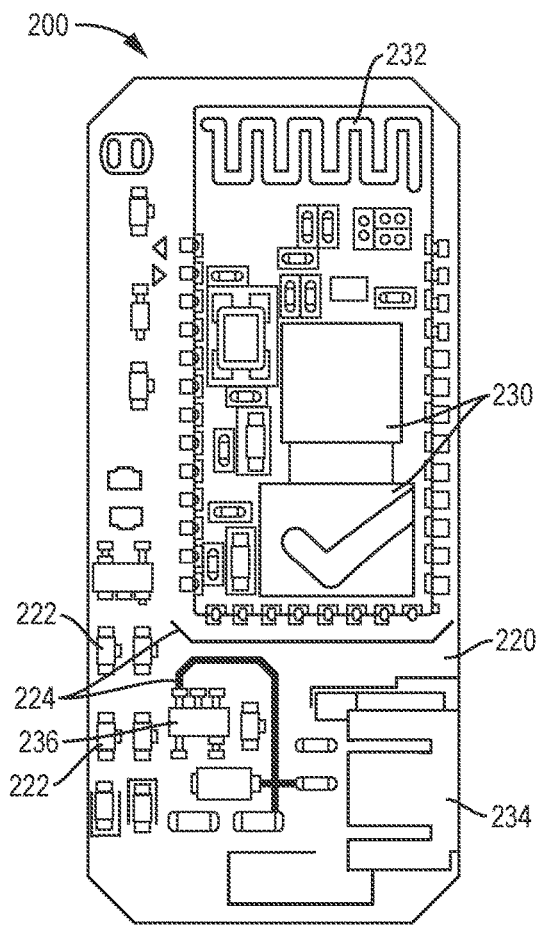
FIG. 3A is a top view of one exemplary embodiment of a Bluetooth Communication and Li-Ion Battery Charging module capable of being coupled to the characterization system of FIG. 1A.
Figure 3B:
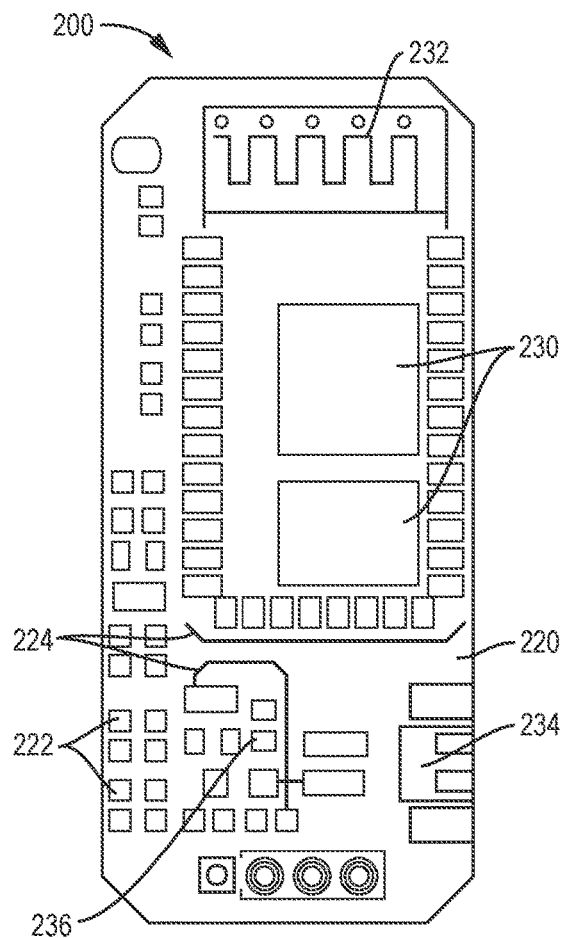
FIG. 3B is a schematic top view of the module of FIG. 3A, presented in a manner to illustrate the two-layer design of the module.
Figure 3C:
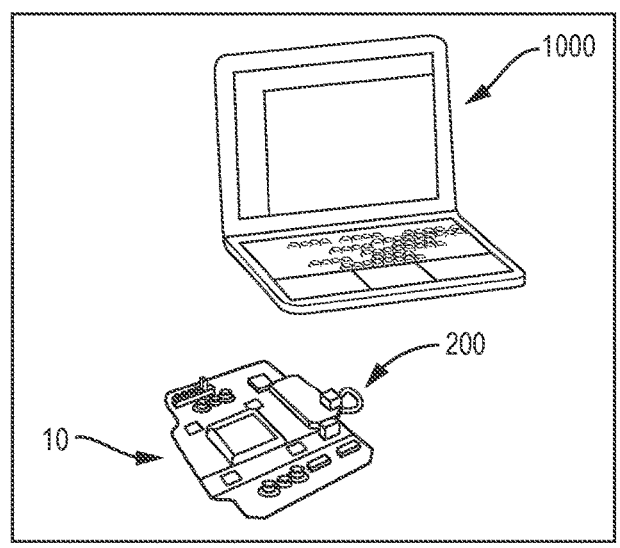
FIG. 3C is a perspective view of the module of FIG. 3A coupled to the characterization system of FIG. 1A, the characterization system of FIG. 1A being wireless Bluetooth in communication with a computer while being powered by a slim-mounted Li-ion battery pack.

FIGS. 3A and 3B illustrate one exemplary embodiment of a module 200 that can be used in conjunction with the system 10, and FIG. 3C illustrates the module 200 being coupled to the system 10, thereby allowing for communication between the system 10 and the computer 1000. The module comprises at least a circuit board 220, a plurality of leads 222, and one or more interfaces 230 (as shown, two Bluetooth chips) designed to perform a particular function. In the illustrated embodiment, the module 200 is a communications module, and the interface 230 provides data communication functionality to permit the system 10 to communicate with an outside device, such as a computer(s), smartphone(s), or other electronic device(s) capable of receiving and/or analyzing data. The communications module 200 provides both Bluetooth functionality, via the Bluetooth chips 230 and a Bluetooth antenna 232, and power, via a battery interface that in the illustrated embodiment includes a battery connector 234 and a battery recharging controller 236. The battery recharging controller 236 can be a chip that can redirect current to start charging a battery if the module 200 gets plugged into USB power, for example. In other embodiments only one of those functionalities may be provided and/or other communications and/or power functionalities can be provided. By providing Bluetooth functionality, the module 200 enables the system 10 to communicate wirelessly with an outside device(s), as illustrated in FIG. 3C, in which the module 200 enables the system 10 to wireless communicate with the computer 1000. Other non-limiting examples of wireless communication that can be incorporated into a module, such as the module 200, include Wi-Fi. Alternatively, or additionally, wired communication, such as by way of one or more of a variety of USB ports (including but not limited to micro-USB ports), can be provided to enable communication between the system 10 and one or more outside devices.

Similar to the system 10, the module 200 can be manufactured using a variety of techniques known to those skilled in the art for forming, printing, or otherwise creating or building circuit boards and related components. As shown in FIG. 3B, the module 200 includes a two-layer design. A first layer includes the circuit board 220 itself, and a second layer includes the leads 222 and electrical components (e.g., wires) 224 that allow for the communication across the circuit board 220. The second layer, or a third layer, can also include attachments or connectors, such as the Bluetooth chip 52 and the battery interface 58, although those components can also be separate components not considered to be part of a particular layer. Notably, the described layers are not necessarily manufactured or placed in a particular numeric order. A footprint of the circuit board 220, and thus the module 200 as illustrated, can be approximately in the range of about 0.5 inches to about 3 inches in length, approximately in the range of about 0.5 inches to about 3 inches in width, and approximately in the range of about 0.25 inches to about 1 inch in height, although other sizes are possible depending, at least in part, on the intended use of the module 200, the sizes and shapes of components of the module 200 and with which the module 200 will be used (e.g., the system 10), and the preferences of the user. In one, non-limiting exemplary embodiment, the module 300 is about 1.75 inches in length by about 0.75 inches in width by about 0.5 inches in height. The size can generally be of the nature that the provided module 200 is able to easily be used with a portable system 10.

Figure 4B:
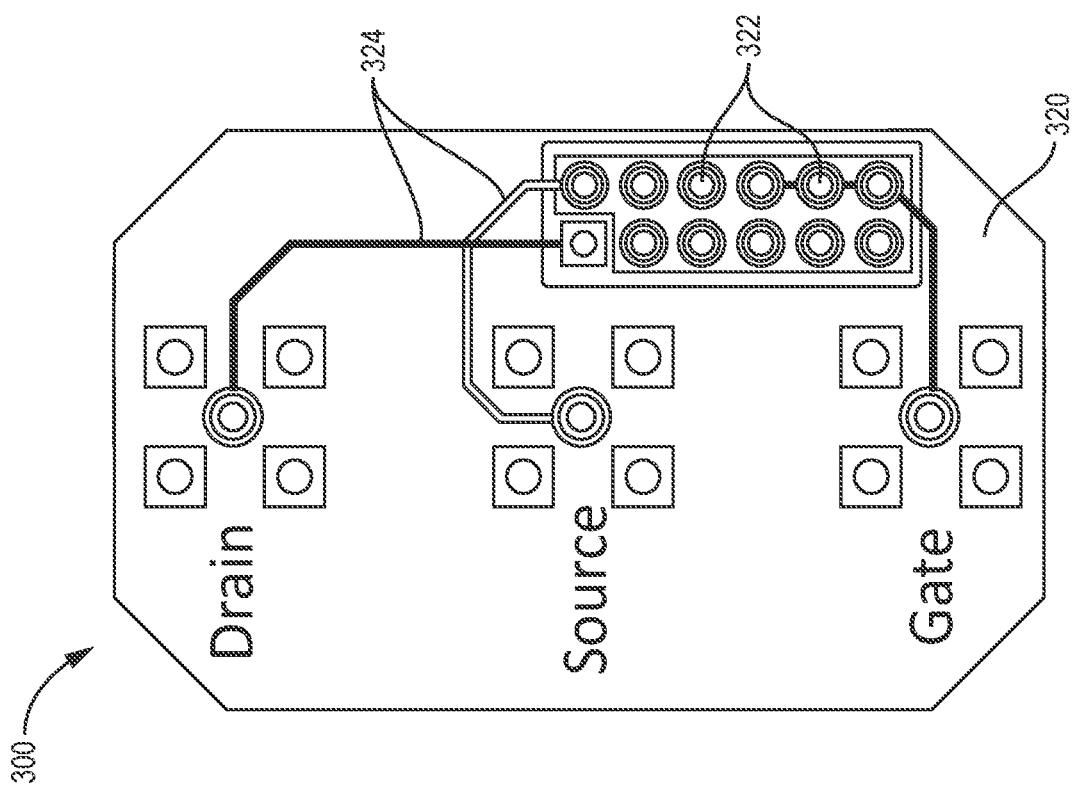
FIG. 4B is a schematic top view of the module of FIG. 4A, presented in a manner to illustrate the two-layer design of the module.
Figure 4A:
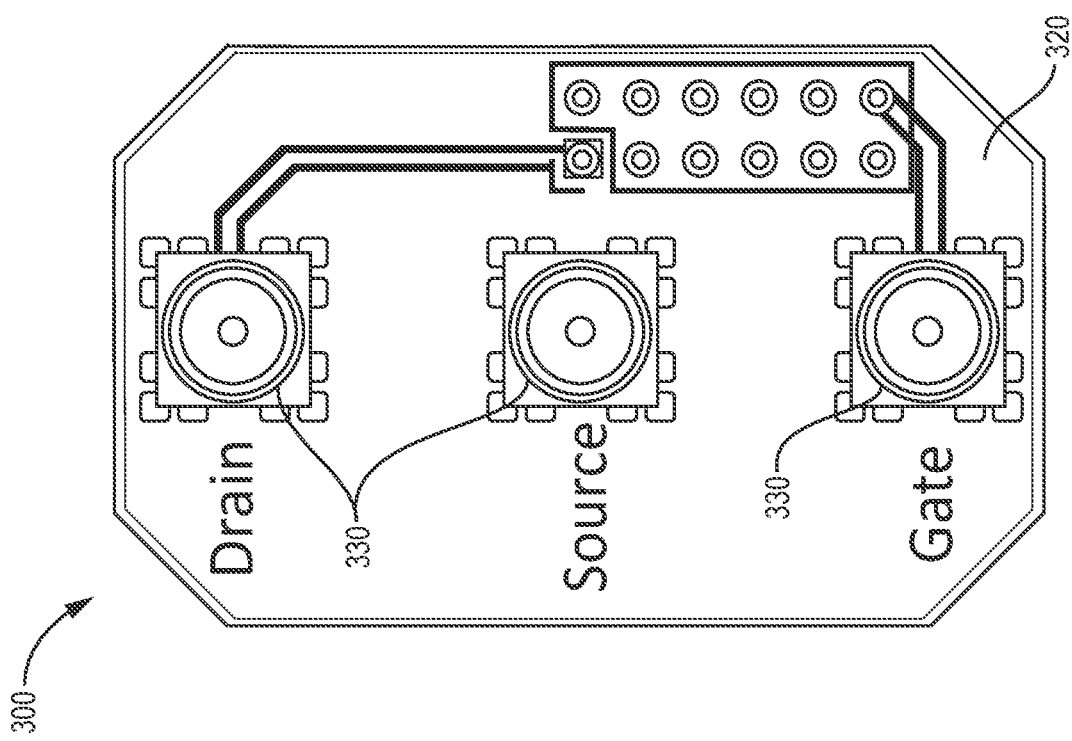
FIG. 4A is a top view of one exemplary embodiment of an Input/Output Expansion module capable of being coupled to the characterization system of FIG. 1A.

FIGS. 4A and 4B illustrate another exemplary embodiment of a module 300 that can be used in conjunction with the system 10. The module 300 comprises at least a circuit board 320, a plurality of leads 322, and one or more interfaces 330, as shown coaxial outputs (e.g., SubMiniature version A (SMA) connectors), designed to perform a particular function. In the illustrated embodiment, the module 300 is a data collection and transfer module, with the coaxial outputs 330 being able to drive measurements from the circuit board 320. This can be convenient, for example, for directly testing a single device when the multiplexing capability of the system 10 is not needed. It can also be useful for coupling the system 10 to other existing benchtop equipment (e.g., an oscilloscope). As shown, the coaxial outputs 330 are conveniently labeled "drain," "source," and "gate," which is ideal when the user wants to measure a three-terminal transistor device that has a gate, a drain, and a source, although other measurements are possible. When the module 300 is coupled to the system 10, it can provide various measurement capabilities that may not already be designed into the system 10 and/or the various measurements able to be made and/or sensed by system 10 can be further enhanced by the module 300, and/or other like-designed or like-purposed modules. Further, various types of adapters and connectors can be used without departing from the spirit of the present disclosure. Thus, while the illustrated embodiment provides for SMA connectors, other types of connectors, including but not limited to Bayonet Neill-Concelman (BNC) connectors, can be used in conjunction with the module 300 or other modules provided for herein or otherwise derivable from the present disclosures.

Similar to the system 10 and the module 200, the module 300 can be manufactured using a variety of techniques known to those skilled in the art for forming, printing, or otherwise creating or building circuit boards and related components. As shown in FIG. 4B, the module 300 includes a two-layer design. A first layer includes the circuit board 320 itself, and a second layer includes the leads 322 and electrical components (e.g., wires) 324 that allow for the communication across the circuit board 320. The second layer, or a third layer, can also include attachments, such as the coaxial outputs 330. Notably, the described layers are not necessarily manufactured or placed in a particular numeric order. A footprint of the circuit board 320, and thus the module 300 as illustrated, can be approximately in the range of about 0.5 inches to about 3 inches in length, approximately in the range of about 0.5 inches to about 3 inches in width, and approximately in the range of about 0.25 inches to about 1.5 inches in height, although other sizes are possible depending, at least in part, on the intended use of the module 300, the sizes and shapes of components of the module 300 and with which the module 300 will be used (e.g., the system 10), and the preferences of the user. In one, non-limiting exemplary embodiment, the module 300 is about 1.75 inches in length by about 1 inch in width by about 1 inch in height. The size can generally be of the nature that the provided module 300 is able to easily be used with a portable system 10.

Referring now to FIGS. 5A and 5B, the characterization system 10 optionally comprises a protective case or housing 70, and collectively the system 10 being disposed in the housing 70 can be considered a device. In the illustrated embodiment the protective case 70 comprises a base plate 72 and a top plate 74 configured to securely fasten to the base plate 72, creating a chamber 76 within which the characterization system 10 can be housed. The base plate 72 includes a top-facing surface 72s on which the circuit board 20 of the system 10 can sit or otherwise rest. As shown, the surface 72s includes a raised portion 72r. The raised portion 72r can include various mating features 72m, as shown bores and screws, which can be used to help mate the circuit board 20 of the system 10 to the base plate 72. The raised portion 72r provides strong support and rigidity behind the chip socket 30 where a user will typically apply the most pressure to insert or remove a chip sample. Further, the raised portion 72r also elevates the circuit board 20 to provide a cavity of space underneath that can contain a battery or other accessory. A person skilled in the art will appreciate the raised portion 72r can have a variety of shapes and sizes while still achieving the intended functions (e.g., strong support and elevated circuit board 20), and thus it is not necessary to state all of the different configurations that can encompass the raised portion 72r. One or more coupling components 72c can be included as a portion of the base plate 72. As shown, there are two coupling components 72c, each having a bore formed therein, the bores being configured to receive a fastener 78 that helps secure the top plate 74 to the bottom plate 72. A perimeter of the base plate 72 includes indentations 72i that correspond to indentations 74i formed on a perimeter of the top plate 74 as well. The indentations 72i, 74i provide an enhanced gripping feature to make it easier to hold the case 70, and thus the system 10 disposed therein, as shown in FIG. 5B. The case 70 can be considered as part of the system 10 in some embodiments, while in other embodiments the system 10 can be a standalone system without the case 70. The case 70 with the system 10 inside can be operated as a handheld unit, placed into instruments, operated on a benchtop, or utilized in any other type of setting known to those skilled in the art for making instrument measurements as intended by this disclosure.

The top plate 74 includes a plurality of openings 80 formed therein to allow access to the system 10, and more particularly the chip socket 30, the interfacing connectors 50, and the connection ports 60, as shown in FIG. 4B. The portions of the system 10 exposed by way of the openings 80 allow for components like the modules 200 and 300, as well as environmental modules (also referred to as environment modules), which are described further below with respect to FIGS. 6A-10, to interact with the system 10 as intended. The case 70 can optionally include mounting features (e.g., sensors) for modules like the modules 200 and 300, as well as the aforementioned environmental modules. As a result of the openings 80 providing access to mounting features associated with the system 10 and the circuit board 20, and mounting features formed on the case 70 itself, various chip samples 100, electronic devices or sensors 110 to be tested, modules (e.g., modules 200 and 300, environmental modules 400), etc. can be electrically coupled to the chip socket 30, the interfacing connectors 50, and/or the connection ports 60. For example, a secure connection can be formed via wire-bonding disposed between electrodes of the device 110 and/or chip samples 100 and one or more of the chip socket 30, interfacing connector(s) 50, and/or connection port(s) 60, among other techniques known to those skilled in the art for creating a stable electrical connection between two electrical components (e.g., the circuit board 20 and components thereof and chip samples 100). As compared to probe stations, the system 10 provides similar performance in terms of accuracy measurements, but provides greatly enhanced speed and throughput, portability, and configurability by way of being able to be used with a plurality of modules, as described in greater detail below.

The top plate 74 can include coupling components 74c that are complimentary to the coupling components 72c of the base plate 72. As shown, the coupling components 74c have a hexagonal shape to receive a nut 74n, and a screw 74s and the nut 74n can be used to secure a connection between the top plate 74 and the bottom plate 72. This can define the chamber 76 of the housing 70 and provide for a protective environment for the system 10, and particularly the circuit board 20 and components associated therewith. More particularly, the housing 70 can provide a sealed environment that resists liquid from entering the chamber 76 to possibly damage components of the system 10 disposed therein. The case 70 can be made of any suitable material and can have additional, optional features that provide ruggedness, ergonomic handling, portability, aesthetics, etc.

Figure 6A:
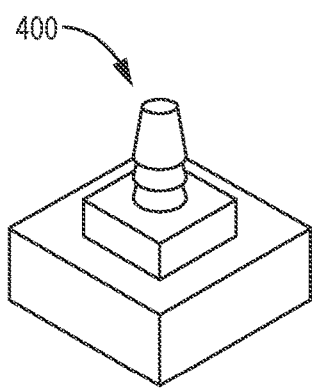
FIG. 6A is a perspective view of one exemplary embodiment of a Vacuum Environment module capable of being coupled to the characterization system of FIG. 1A.
Figure 6B:
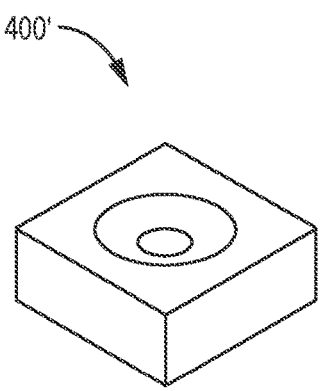
FIG. 6B is a perspective view of one exemplary embodiment of a Liquid Environment module capable of being coupled to the characterization system of FIG. 1A.
Figure 6C:
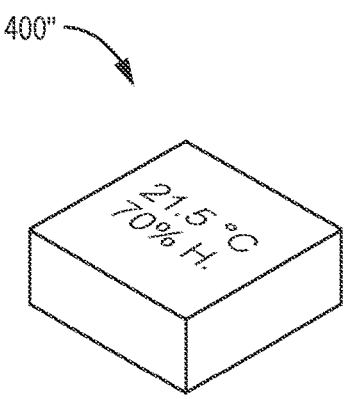
FIG. 6C is a perspective view of one exemplary embodiment of an Environment Monitoring module capable of being coupled to the characterization system of FIG. 1A.

Another aspect of the characterization system 10 that is optional is environmental modules 400, 400', 400", such as those illustrated in FIGS. 6A, 6B, and 6C, respectively. These modules 400, 400', 400" can be configured to interface with the chip sample 100 and/or the characterization system 10 and immerse the electronic device(s) 110 in a prescribed environment. These modules can provide, for example, liquid environments, controlled gas environments, vacuum environments, specific temperature and/or lighting conditions, dynamic solution exchange environments, electrical characterization of devices during in-situ microscopy, and/or controlled exposure to electromagnetic radiation. Further, the environmental module can act as an additional monitoring and data collection point for non-electrical characteristics, such as temperature and humidity. Other measurement types will be evident to a person skilled in the art and are within the scope of the present disclosure. In addition to these non-limiting example modules, many more are envisioned that exist and/or can be designed as simple additions to the base platform due to the extensible nature of the base platform. The modular and expandable nature of the disclosed system 10 makes it well suited to performing experiments of many types, while the low cost, multiplexing, and automated nature allow many experiments to be run in parallel.

More particularly, the module 400 illustrated in FIG. 6A is a vacuum and controlled atmosphere module. This module enables the atmosphere surrounding the chip socket 30 to be controlled, and can provide for operation and measurements to occur in a vacuum environment, a partial vacuum environment, a controlled gas environment, or similar, if desired. The module 400' illustrated in FIG. 6B is a liquid immersion module. This module enables the chip socket 30 to be operable and measurable in an environment in which the chip socket 30 is immersed or otherwise surrounded by one or more liquids. The module 400" illustrated in FIG. 6C is an ambient sensing module. This module enables an environment surrounding the chip socket 30 to be controlled, for example by adjusting temperature and humidity levels as desired. As more clearly illustrated in FIGS. 7-10, the modules 400, 400', and 400" can be coupled to the housing 70 of the system 10 to supply the environment change to be used in testing the electronic device disposed in or otherwise coupled to the chip socket 30. A person skilled in the art will appreciate additional modules, environmental or otherwise, that can be used in conjunction with the system 10 without departing from the spirit of the present disclosure. Further, a person skilled in the art will appreciate that a wide range of functionalities can be realized through modules, including but not limited to synchronization of measurements with other tools, in-situ measurements during imaging and/or microscopy, exposure to any type of radiation produced by a device during measurement, exposure to chemicals (whether solid, liquid, gas, and/or plasma), among other modules that can be used in conjunction with the novel system 10, and other novel systems disclosed herein or otherwise derivable from the present disclosures.

In particular with respect to a vacuum module, the disclosed system provides advantages over conventional systems, which present challenges in operating and communicating from within an ambient vacuum environment. By contrast, the present disclosure can simply and effectively provide a vacuum only at the point of testing. Similar advantages can result from other modules, like the modules 400' and 400", as well as the modules 500, 600, and 700 discussed below and other modules provided for herein or otherwise derivable in view of the present disclosures.

Figure 7:
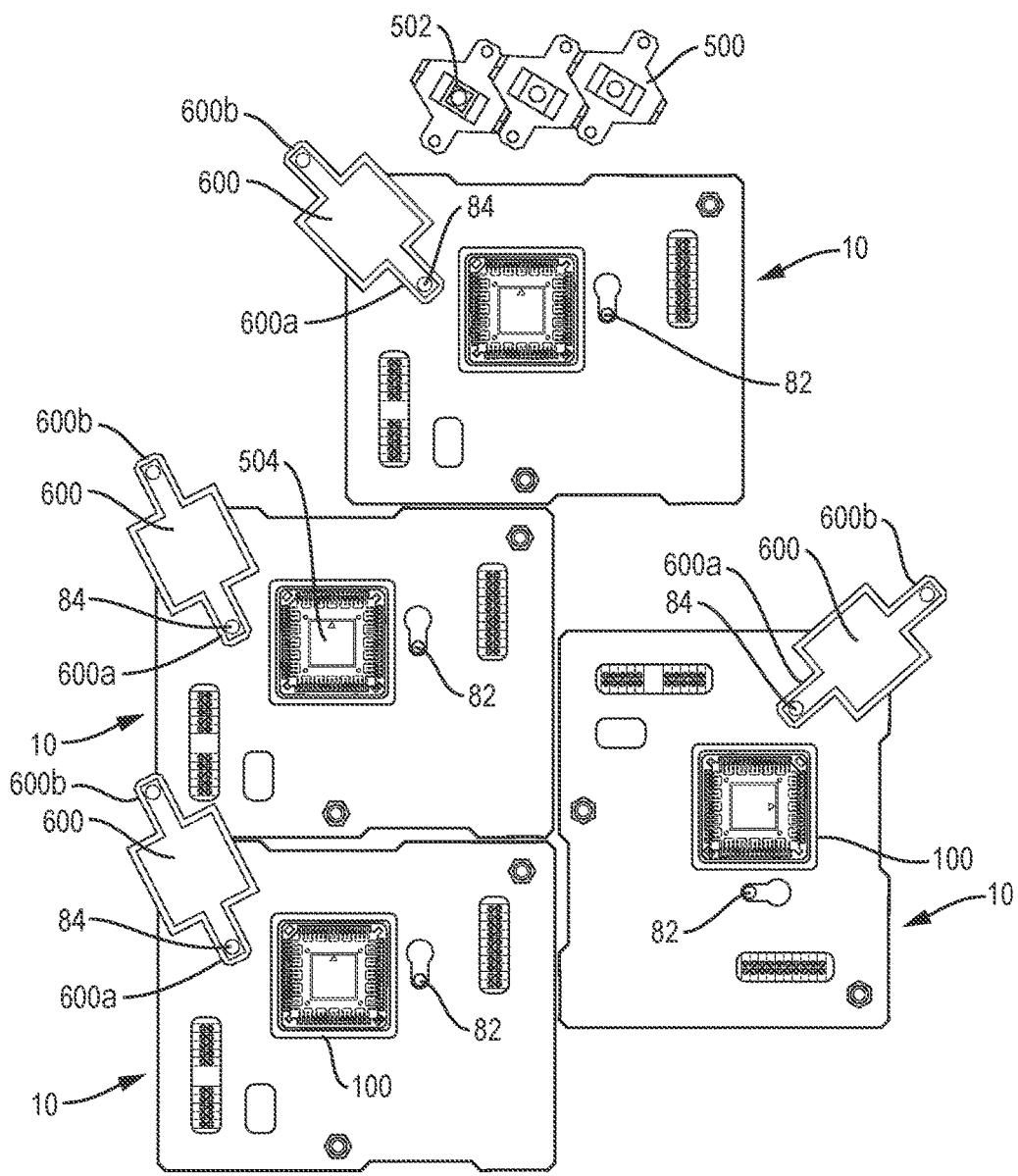
FIG. 7 is a top perspective view of a plurality of the characterization systems of FIG. 1A disposed within the housing of FIG. 5A and a plurality of modules capable of being coupled to the illustrated characterization systems.

FIGS. 7-10 illustrates some example prototype embodiments of various modules 500, 600, and 700. FIG. 7 shows four individual systems 10 with various modules 500, 600, including a liquid environmental module 500 and a plurality of modules 600 configured for testing devices in the dark, i.e., a no light environment. As shown, the module 500 can include a gasket 502 that interfaces between the module 500 and an electronic device/sensor substrate 504. In use, the module 500 can be slipped upside-down and pressed onto a surface of a device-under-test such that the gasket 502 engages with the surface. In conjunction with pressing the module 500 onto the surface of the device-under-test, the module can be secured to the housing 70 using similar techniques described herein (e.g., using nuts, bolts, screws, etc.), including but not limited to those discussed further below with respect to the modules 600 and 700. The liquid environmental module 500 can be used, for example to map signal-to-noise ratios in a liquid environment.

As illustrated in FIG. 7, each of the modules 600 can be coupled to the housing 70 by way of a coupling mechanism or mount. In the illustrated embodiment this comprises a screw 82 extending away from the top face 74 and a corresponding nut 84 that receives the screw 82 to maintain a location of one end 600a of the module 600 with respect to the housing 70. As also illustrated in FIG. 7, the chip socket 30 of each system 10 can receive an electronic device therein for purposes of being tested. As demonstrated by FIGS. 7-9, modules like the module 600 can be disposed over the chip socket 30, and thus the electronic device being tested, to enable a particular environment, exposure, measurement modality, or other function to be supplied to the electronic device during a test. Different modules can be easily swapped in and out to enable the electronic device to be tested across multiple and/or diverse environments over a short period of time. The foregoing notwithstanding, a person skilled in the art will appreciate that some modules may require further work beyond simple adaptation to be able to be used in conjunction with the system 10, or other systems provided for herein or otherwise derivable from the present disclosure. Such work may provide future opportunities for inventions.

Figure 8:
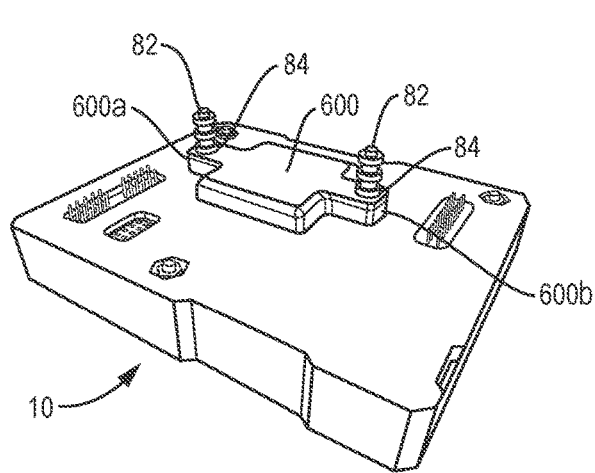
FIG. 8 is a perspective view of one exemplary embodiment of a Dust Cover module coupled to the characterization system of FIG. 1A disposed within the housing of FIG. 5A.

FIG. 8 shows the module 600 fully attached to the housing 70, and thus the system 10. As shown, a second screw 82 and nut 84 can be used to secure a location of a second, opposed end 600b of the module 600 with respect to the housing 60. The configuration of the module 600 is such that it blocks light from entering into the chamber 76 of the housing, thus providing a dark environment for testing. The system 10 and module 600, among other systems and modules presented herein or otherwise derivable from the present disclosures, can be used to perform tests in an open lab, in a dark box that shields the device from light, radio frequency radiation, etc., and/or with devices exposed to a certain frequency and intensity of light to determine the response of the device to that stimulus. A person skilled in the art will appreciate other environments in which the system 10 and related modules can be used. Further, a person skilled in the art will appreciate that other configurations may regulate an amount of light entering the chamber 76 such that different amounts of light levels can be tested, or a controlled light source can be incorporated into the module while other extraneous light is blocked. The module 600 can also be useful for protecting a potentially fragile chip that remains inserted into the chip socket 30 while the system is not in use, especially while the system is being transported (e.g., carried in a bag or backpack, shipped through a mail service with or without a chip sample ready to be tested at the destination, etc.). The module 600 can also be fitted to improve measurement fidelity, for example by isolating devices under test from thermal variations, radio frequency radiation, and/or other undesirable noise sources.

Figure 9:
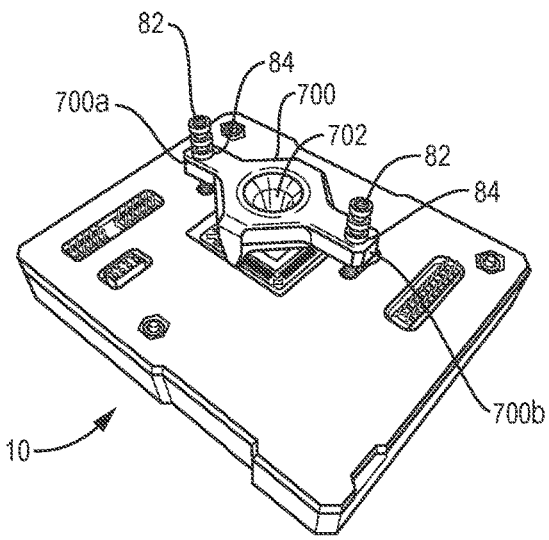
FIG. 9 is a perspective view of another exemplary embodiment of a Liquid Environment module coupled to the characterization system of FIG. 1A disposed within the housing of FIG. 5A.
Figure 10:
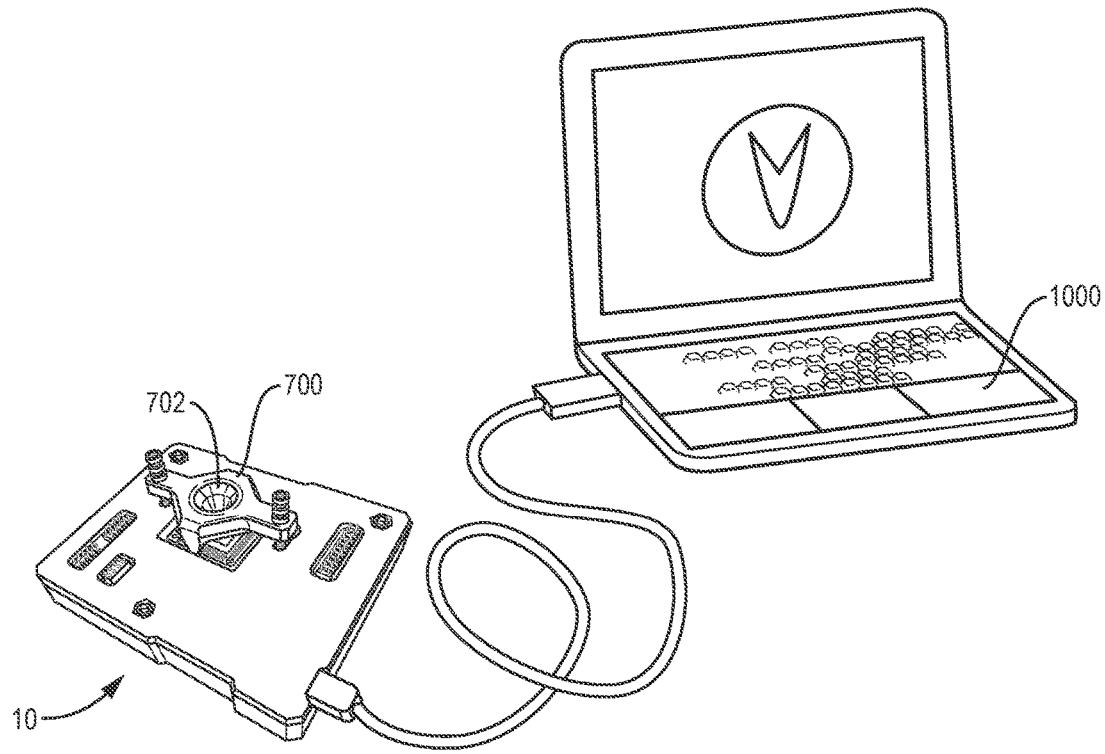
FIG. 10 is a perspective view of the module of FIG. 9 coupled to the characterization system of FIG. 1A disposed within the housing of FIG. 5A, the characterization system being in communication with a computer.

FIG. 9 shows the system 10 with an attached module 700 for testing devices in a liquid environment. As shown, the module 700 can be coupled to the system 10 using the same screw 82 and nut 84 configuration discussed with respect to FIGS. 7 and 8. The module 700 includes an opening 702 configured to allow one or more liquids to be deposited into the chamber 76 of the housing 70, thereby allowing for testing to be performed in a liquid environment. FIG. 10 shows a characterization system connected to a laptop, which can be controlled with custom software. In these embodiments, the modules are designed to rest on the socket or inside the perimeter of the chip sample. The modules can be mated to the surface of the socket or chip sample using any suitable mounting feature. This can be accomplished, for example, by adhesives, gaskets, clamping (e.g., clips, spring locks, screws, bolts), or a combination thereof. It is also envisioned that the chip socket itself can comprise features for interfacing with the environmental module. These can include features such as ridges, grooves, tabs, hooks, locating features, etc.

A key advantage to the system 10 of the present disclosure, as well as other systems derivable from the present disclosures, is the versatility and modularity afforded by its design, which in turn affords the ability for a user to customize the control of the characterization(s) that is performed by the system 10. In contrast, existing probe systems use manually guided micromanipulators to make contact to devices, using dedicated instruments (e.g., SMUs, semiconductor parameter analyzers, etc.) that are expensive and typically limited for use in a single type of test. Further, existing probe systems typically lack flexibility and are unable to run the same test on a device in different conditions and/or environments. The present disclosure allows for tests to be performed in rapid succession, where any change in hardware, like providing a new environmental module, can occur in a manner of seconds or, at most, a minute or two. Still further, existing probe systems typically do not allow for the rapid switching between testing and monitoring different devices, particularly in an automated fashion, to monitor many devices simultaneously. The disclosed systems provide for multiplexing and portability, among the other benefits identified in this paragraph and elsewhere in the present disclosure.

Software can assist in executing the tests on the characterization system 10 and can help make the system automated. With that said, the system 10 itself is automated, even without the software. For example, because the system 10 has on-board multiplexers 21, it is possible for software to seamlessly select from one device to the next in an automated fashion. This is in contrast to a manual probe-based system, in which the software typically prompts the user when it is time to move the probes from one device to the next. As noted herein, for existing systems, this entails the user manually, physically moving the probes to perform the next test, a time-intensive, labor-intensive process that is eliminated by the system 10 and related disclosures provided for herein. The software can be existing software that can be used with little to no modifications, existing software that requires some modification within the skill of the art to operate in conjunction with the system 10 and modules (e.g., modules 200, 300, 400, 400', 400", 500, 600, and 700), or software designed and created to be used in conjunction with the system 10 and modules (e.g., modules 200, 300, 400, 400', 400", 500, 600, and 700). Ideally the software can be configured to measure multiple devices on a single chip sample without manual manipulation, although it is possible that further inventive work may need to be performed to provide desirable software for this purpose. A preferred software would enable various customized testing protocols to be run in parallel or series to characterize multiple devices simultaneously. Preferred software would also, at least optionally, comprise a user interface with customizable visualization, analysis, and data export capabilities. Other optional features may include: data visualization; settings; experiment setup, schedule, and queue; data browser; etc.

The modules (e.g., modules 200, 300, 400, 400', 400", 500, 600, and 700) can also provide for physical automation, similar to the system 10. For example, a liquid pumping module can swap different chemicals and concentrations of solutions in and out of proximity to the chip sample positioned in the chip socket 30 while controlling flow rates and/or making changes (e.g., continuous changes) to the solution environment that the device-under-test is exposed to over a period of time (e.g., four hours). Software can be involved in queuing up the actions to be performed by the module, further enhancing automation, but the physical set-up of the module in and of itself provides for automation not currently available in existing systems and modules. For example, even a module like the module 600, which is designed to block external light, it can be configured to control light sources within it such that it can allow light intensities and frequencies to be changed dynamically throughout a test and/or experiment. Such flexibility and automation is challenging with existing systems at least because it can be difficult to coordinate the behaviors of multiple instruments, thereby making any type of automation difficult. The interoperability of the systems and modules disclosures herein enable automation in a way that is not typically feasible with traditional systems.

Hence, the disclosed characterization system has improved capabilities compared to conventional systems, by providing the ability to robustly and simultaneously conduct multiple types of tests for multiple devices or sensors, as well as environmental testing, all within a single portable unit. While portable, the system 10 also allows for long-term sensor measurement. In some instances, the system 10 can be set-up to run test for an extended period of time (e.g., at least seven days, several months, etc.).

Another aspect of the present disclosure provides an electronic characterization platform. The platform comprises a circuit board according to any of the embodiments described herein. The platform can be used to characterize electronic devices and sensors that are not on a chip sample and/or are external to the platform. For example, rather than having a chip socket, the platform can have output pins for the connection of an expansion module or wired connector. As an example, a module could be connected that allows the attachment of wires with alligator clip connectors for measuring characteristics of an electronic device that is mounted in an external test station. In another example, one or more electronic sensors can be mounted directly to an expansion module and connected to the platform for measurement.

A testing kit can be provided that includes a plurality of the various components disclosed herein. For example, the system 10 can be supplied with a plurality of modules, such as the modules 200, 300, 400, 400', 400", 500, 600, 700, and other variations thereof, to allow for different types of testing, and/or different parameters associated with the testing, to be performed with one supplied kit.

Some aspects of the systems and methods described herein can be implemented in hardware, software, firmware, or combinations of hardware, software and/or firmware. In some examples, the aspects may be implemented using a non-transitory computer readable medium storing computer executable instructions that when executed by one or more processors of a computer cause the computer to perform operations. Computer readable media can include non-transitory computer-readable media, such as disk memory devices, chip memory devices, programmable logic devices, random access memory (RAM), read only memory (ROM), optical read/write memory, cache memory, magnetic read/write memory, flash memory, and application-specific integrated circuits. In addition, a computer readable medium that implements systems and methods described in this specification may be located on a single device or computing platform or may be distributed across multiple devices or computing platforms.

Systems of the nature provided for herein, including but not limited to the system 10, can be used, for example to characterize nanoscale transistors, provide long-term electrical bias studies of electronic devices and/or sensors, enhance in-situ microscopy, and characterize electrical sensors in controlled environments (e.g., gas and/or liquid environments). Such systems can also be used to source and/or measure small currents and to easily implement highly automated experiments in various lab settings (e.g., classroom, university, medical research, industry research, government research), among other uses provided for herein or otherwise derivable by a person skilled in the art in view of the present disclosures.

One skilled in the art will readily appreciate that the present disclosure is well adapted to carry out the objects and obtain the ends and advantages mentioned, as well as those inherent therein. Further, one skilled in the art will appreciate further features and advantages of the disclosure based on the above-described embodiments. Accordingly, the disclosure is not to be limited by what has been particularly shown and described, except as indicated by the appended claims. For example, the various modules provided for herein are non-limiting, and a person skilled in the art will appreciate other modules that can be sued in conjunction with the system 10.

No admission is made that any reference, including any non-patent or patent document cited in this specification, constitutes prior art. In particular, it will be understood that, unless otherwise stated, reference to any document herein does not constitute an admission that any of these documents forms part of the common general knowledge in the art in the United States or in any other country. Any discussion of the references states what their authors assert, and the applicant reserves the right to challenge the accuracy and pertinence of any of the documents cited herein. All references cited herein are fully incorporated by reference, unless explicitly indicated otherwise. The present disclosure shall control in the event there are any disparities between any definitions and/or description found in the cited references.

The invention claimed is:

1. An electronic device characterization system, comprising: a circuit board; a chip adapter coupled to the circuit board, the chip adapter being configured to receive one or more chip samples for characterization testing; one or more environmental module mounts, the mounts being configured to couple one of a plurality of environmental modules to the circuit board such that the one environmental module is disposed over the chip adapter to allow the environmental module to provide a desired environment to the chip sample being tested; one or more interfacing connectors configured to receive one or more external communication devices to enable the system to communicate with a computer: and a housing defining a chamber, the housing having a plurality of openings formed therein to provide access to the chamber, wherein a first opening of the plurality of openings provides access to the chip adapter, and wherein at least one additional opening of the plurality of openings provides access to at least one interfacing connector of the one of more interfacing connectors.

2. The electronic device characterization system of claim 1, wherein the circuit board is disposed in the chamber of the housing.

3. The electronic device characterization system of claim 1, further comprising: one or more external communication devices configured to provide data communication with a computer.

4. An electronic device characterization system comprising: a housing defining a chamber, the housing have a plurality of openings formed therein to provide access to the chamber; a circuit board; a chip adapter coupled to the circuit board, the chip adapter being configured to receive one or more chip samples for characterization testing; one or more environmental module mounts, the mounts being configured to couple one of a plurality of environmental modules to the circuit board such that the one environmental module is disposed over the chip adapter to allow the environmental module to provide a desired environment to the chip sample being tested; and one or more modular connectors configured to receive one or more expansion modules to provide additional testing capabilities to the system, wherein a first opening of the plurality of openings provides access to the chip adapter, and wherein at least one additional opening of the plurality of openings provides access to at least one modular connector of the one or more modular connectors.

5. The electronic device characterization system of claim 1, further comprising: one or more expansion modules configured to provide additional testing capabilities to the electronic device characterization system.

6. The electronic device characterization system of claim 1, further comprising: a plurality of environmental modules configured to be at least one of coupled to or disposed above the circuit board by way of the one or more environmental module mounts, each environmental module of the plurality of environmental module being configured to provide a prescribed environment to the chip sample being tested.

7. The electronic device characterization system of claim 6, wherein the prescribed environment of at least one environmental module of the plurality of environmental modules is a vacuum environment.

8. The electronic device characterization system of claim 1, further comprising: programmable analog circuitry disposed on the circuit board.

9. The electronic device characterization system of claim 8, wherein the programmable analog circuitry further comprises two or more of the following, all in electrical communication with each other and with the chip adapter: one or more analog multiplexers; one or more digital-to-analog converters; one or more transimpedance amplifiers; one or more analog-to-digital converters; one or more processors; or one or more analog switches disposed between at least two or the one or more analog multiplexers, digital-to-analog converters, transimpedance amplifiers, analog-to-digital converters, or processors.

10. A method of electronically characterizing a device or sensor, comprising: disposing a chip sample in a chip adapter coupled to a circuit board; providing a first prescribed environment to the chip sample disposed in the chip adapter by way of a first environment module; performing a first electronic characterization test of the chip sample while the chip sample is exposed to the first prescribed environment; removing the first prescribed environment away from the chip sample; providing a second prescribed environment to the chip sample disposed in the chip adapter by way of a second environment module; performing a second electronic characterization test of the chip sample while the chip sample is exposed to the second prescribed environment; and communicating results from the first and second electronic characterization tests to an outside source, wherein the circuit board is provided as a standalone component such that the actions of providing the first and second prescribed environments are performed in rapid succession.

11. The method of claim 10, wherein the circuit board and chip adapter are disposed within a portable housing such that the actions of performing the first and second electronic characterization tests are performed using a portable, handheld system.

12. The method of The method of wherein providing a first prescribed environment to the chip sample disposed in the chip adapter by way of a first environment module comprises coupling the first environment module to the portable housing such that at least a portion of the first environment module is disposed above the chip adapter, and wherein providing a second prescribed environment to the chip sample disposed in the chip adapter by way of a second environment module further comprises coupling the second environment module to the portable housing such that at least a portion of the second environment module is disposed above the chip adapter.

13. The method of claim 10, further comprising: at least one of coupling one or more external communication devices to the circuit board or disposing the one or more external communication devices above the chip adapter, wherein communicating results from the first and second electronic characterization tests to an outside source comprises operating the one or more external communication devices to communicate the results from the first and second electronic characterization tests to an outside source.

14. The method of claim 10, further comprising: at least one of coupling one or more expansion modules to the circuit board or disposing the one or more expansion modules above the chip adapter, performing a third electronic characterization test using the one or more expansion modules, the third electronic characterization test being performed simultaneously with at least one of the first electronic characterization test and the second characterization test.

15. The method of claim 10, wherein at least one of the first and second prescribed environments is a vacuum environment.

16. The method of claim 10, wherein the actions of performing the first and second electronic characterization tests is automated.

17. The method of claim 10, wherein the circuit board comprises programmable analog circuitry disposed thereon.

18. The method of claim 17, wherein the programmable analog circuitry further comprises two or more of the following, all in electrical communication with each other and with the chip adapter: one or more analog multiplexers; one or more digital-to-analog converters; one or more transimpedance amplifiers; one or more analog-to-digital converters; one or more processors; or one or more analog switches disposed between at least two or the one or more analog multiplexers, digital-to-analog converters, transimpedance amplifiers, analog-to-digital converters, or processors.

19. The electronic device characterization system of claim 4, wherein the circuit board is disposed in the chamber of the housing.

20. The electronic device characterization system of claim 4, further comprising: one or more expansion modules configured to provide additional testing capabilities to the electronic device characterization system.

21. The electronic device characterization system of claim 4, further comprising: a plurality of environmental modules configured to be at least one of coupled to or disposed above the circuit board by way of the one or more environmental module mounts, each environmental module of the plurality of environmental module being configured to provide a prescribed environment to the chip sample being tested.

* * * * *